US005747217A

United States Patent [19]

Zaklika et al.

[11] Patent Number: 5,747,217

[45] Date of Patent: May 5, 1998

[54] LASER-INDUCED MASS TRANSFER IMAGING MATERIALS AND METHODS UTILIZING COLORLESS SUBLIMABLE COMPOUNDS

[75] Inventors: Krzysztof A. Zaklika, St. Paul; Stanley C. Busman, Minneapolis; Gregory D. Cuny, Woodbury, all of Minn.

[73] Assignee: Minnesota Mining And Manufacturing Company, Saint Paul, Minn.

[21] Appl. No.: 627,305

[22] Filed: Apr. 3, 1996

[51] Int. Cl.[6] .......... G03F 7/11

[52] U.S. Cl. .......... 430/158; 430/157; 430/162; 430/200; 430/201; 430/252; 430/253; 430/254; 430/302; 430/945

[58] Field of Search .......... 430/157, 158, 430/162, 200, 201, 252, 253, 254, 302, 945

[56] References Cited

U.S. PATENT DOCUMENTS

| | | | |
|---|---|---|---|
| 2,714,066 | 7/1955 | Jewett et al. . | |
| 2,992,121 | 7/1961 | Frances et al. . | |
| 3,751,257 | 8/1973 | Dahlman . | |
| 3,790,556 | 2/1974 | Doggett . | |
| 3,964,389 | 6/1976 | Peterson . | |
| 4,038,253 | 7/1977 | Kramer . | |
| 4,039,521 | 8/1977 | Smith . | |
| 4,245,003 | 1/1981 | Oransky et al. . | |
| 4,252,671 | 2/1981 | Smith . | |
| 4,307,182 | 12/1981 | Daizell et al. | 430/339 |
| 4,315,983 | 2/1982 | Kawarmura et al. | 430/70 |
| 4,339,522 | 7/1982 | Balanson et al. | 430/192 |
| 4,401,743 | 8/1983 | Incremona | 430/157 |
| 4,415,621 | 11/1983 | Specht et al. | 428/172 |
| 4,491,432 | 1/1985 | Aviram et al. | 400/241.1 |
| 4,508,811 | 4/1985 | Gravesteijn et al. | 430/270 |
| 4,549,824 | 10/1985 | Sachdev et al. | 400/241.1 |
| 4,582,776 | 4/1986 | Matsui et al. | 430/270 |
| 4,588,674 | 5/1986 | Stewart et al. | 430/273 |
| 4,656,121 | 4/1987 | Sato et al. | 430/495 |
| 4,702,958 | 10/1987 | Itoh et al. | 428/323 |
| 4,711,834 | 12/1987 | Butters et al. | 430/201 |
| 4,833,124 | 5/1989 | Lum | 503/227 |
| 4,912,083 | 3/1990 | Chapman et al. | 503/227 |
| 4,942,141 | 7/1990 | DeBoer et al. | 503/227 |
| 4,948,776 | 8/1990 | Evans et al. | 503/227 |
| 4,948,777 | 8/1990 | Evans et al. | 503/227 |
| 4,948,778 | 8/1990 | DeBoer | 503/227 |
| 4,950,639 | 8/1990 | DeBoer et al. | 503/227 |
| 4,952,552 | 8/1990 | Cahpman et al. | 503/227 |
| 5,023,229 | 6/1991 | Evans et al. | 503/227 |
| 5,024,990 | 6/1991 | Chapman et al. | 503/227 |
| 5,089,372 | 2/1992 | Kirihata et al. | 430/167 |
| 5,156,938 | 10/1992 | Foley et al. | 430/200 |
| 5,166,024 | 11/1992 | Bugner et al. | 430/70 |
| 5,169,828 | 12/1992 | Janssens et al. | 430/201 |
| 5,171,650 | 12/1992 | Ellis et al. | 430/20 |
| 5,256,506 | 10/1993 | Ellis et al. | 430/20 |
| 5,256,517 | 10/1993 | Roeschert et al. | 430/165 |
| 5,278,023 | 1/1994 | Bills et al. | 430/201 |
| 5,286,604 | 2/1994 | Simmons, III | 430/286 |
| 5,308,736 | 5/1994 | Defieuw et al. | 430/201 |
| 5,308,737 | 5/1994 | Bills et al. | 430/201 |
| 5,326,666 | 7/1994 | Vanmaele et al. | 430/201 |
| 5,326,826 | 7/1994 | Roeschert et al. | 525/326.5 |
| 5,340,699 | 8/1994 | Haley et al. | 430/302 |
| 5,351,617 | 10/1994 | Williams et al. | 101/467 |
| 5,360,694 | 11/1994 | Thien et al. | 430/200 |
| 5,360,781 | 11/1994 | Leenders et al. | 503/227 |
| 5,387,687 | 2/1995 | Scrima et al. | 546/187 |
| 5,401,607 | 3/1995 | Takiff et al. | 430/253 |
| 5,418,110 | 5/1995 | Uytterhoeven et al. | 430/201 |
| 5,432,040 | 7/1995 | Defieuw et al. | 430/201 |
| 5,457,000 | 10/1995 | Defieuw et al. | 430/201 |
| 5,476,746 | 12/1995 | Janssens et al. | 430/200 |
| 5,510,225 | 4/1996 | Janssens et al. | 430/200 |
| 5,568,170 | 10/1996 | Hirano et al. | 347/51 |
| 5,691,098 | 11/1997 | Busman et al. | 430/200 |

FOREIGN PATENT DOCUMENTS

| | | |
|---|---|---|
| 0 063 000 | 10/1982 | European Pat. Off. . |
| 0 318 944 | 6/1989 | European Pat. Off. . |
| 0 318 945 | 6/1989 | European Pat. Off. . |
| 0 319 331 | 6/1989 | European Pat. Off. . |
| 462704 | 12/1991 | European Pat. Off. . |
| 568 993 | 11/1993 | European Pat. Off. . |
| 602893 | 6/1994 | European Pat. Off. . |
| 1470530 | 4/1977 | United Kingdom . |
| 2 176 018 | 12/1986 | United Kingdom . |
| WO 89/10845 | 11/1989 | WIPO . |
| WO 95/13195 | 5/1995 | WIPO . |

OTHER PUBLICATIONS

M.R. Andrews, "Vapor Pressure of Naphthalene at Low Temperatures", *J. Phys. Chem.* 30, 1497–1500 (1926).

C.A. Angell et al., "Strong and Fragile Plastic Crystals" *J. Chim. Phys.*, 82, 773–777 (1995).

E.W. Balson, "Studies in Vapour Pressure Measurement, Part III.—An Effusion Manmeter Sensitive to $5\times10^{-6}$ Millimetres of Mercury: Vapour Pressure of D.D.T. and other Slightly Volatile Substances", *Trans. Faraday Soc.*, 43, 54–60 (1947).

K.A. Bello et al., "Near-infrared-absorbing Squaraine Dyes containing 2,3-Dihydroperimidine Terminal Groups", *J. Chem. Soc., Chem. Commun.*, 452–454 (1993).

R.S. Bradley et al., "The Vapour Pressure and Lattice Energy of Hydrogen-bonded Crystals. Part I. Oxamide, Oxamic Acid, and Rubeanic Acid", *J. Chem. Soc.*, 1681–1684 (1953).

R.S. Bradley et al., "The Vapour Pressure and Lattice Energy of Hydrogen-bonded Crystals. Part II. α-and β-Anhydrous Oxalic Acid and Tetragonal Pentaerythritol", *J. Chem. Soc.*, 1684–1688 (1953).

(List continued on next page.)

*Primary Examiner*—Christopher G. Young

*Attorney, Agent, or Firm*—Walter N. Kirn; Gregory A. Evearitt; Arlene K. Musser

[57] ABSTRACT

The invention relates to a method of increasing the sensitivity of laser induced thermal imaging by using certain sublimable compounds. The invention is useful in the field of thermal transfer imaging for the production of various graphic arts media.

18 Claims, No Drawings

OTHER PUBLICATIONS

R.S. Bradley et al., "The Vapour Pressure and Lattice Energy of Hydrogen–bonded Crystals. Part III. 2–Thenoic, 2–Furoic, and Pyrrole–2–carboxylic Acids", *J. Chem. Soc.*, 1688–1690 (1953).

R.S. Bradley et al., "The Vapour Pressure and Lattic Energy of Some Aromatic Ring Compounds", *J. Chem. Soc.*, 1690–1692 (1953).

*The Colour Index, Third Edition*; The Society of Dyers and Colorists: Yorkshire, England; vols. 1–8 (1971, 1982, and 1987)—title page, copyright page and table of contents only.

A.S. Coolidge et al., "The Sublimation Pressures of Substituted Quinones and Hydroquinones", *J. Am. Chem. Soc.*, 49, 100–104 (1927).

H. Cordes et al., "Determination of the evaporation coefficient of hexamethylenetetramine by the Knudsen effusion method", *Z. Phys. Chem (Neue Folge)*, 45, 186–195 (1965)—with English Language abstract from *Chem Abs.*, 63, Abstract No. 15591c (1965).

J.D. Cox et al. in *Thermochemistry of Organic and Organometallic Compounds*; Academic Press: New York; 1970—Title Page, Copyright Page and Table of Contents Only.

M. Davies et al., "The Lattice Energies of the Straight–Chain Primary Amides", *Trans. Faraday Soc.*, 55, 1100–1108 (1959).

M. Davies et al., "Lattice Energies of Some N–methyl Amides and of Some Carbamates", *Trans. Faraday Soc.*, 55 1329–1332 (1959).

M. Davies et al., "The Sublimation Pressures and Heats of Sublimation of Some Carboxylic Acids", *Trans. Faraday Soc.*, 50, 1042–1047 (1954).

J.A. Dean, "Physicochemical Relationships" in *Lange's Handbook of Chemistry*; McGraw–Hill: New York; Chapter 9, pp. 9.1–9.9 (1992).

W.J. Dunning, "Crystallographic Studies of Plastic Crystals", *J. Phys. Chem. Solids*, 18, 21–27 (1961).

B. Eistert et al., "Experiments with 'Meldrum's acid' and other cyclic esters (acylals) of malonic acids", *Chem. Ber.*, 94, 929–947 (1961)—with English Language abstract from *Chem Abs.*, 55, Abstract No. 22125e (1961).

B. Eistert et al., "Homocamphorquinone and several of its derivatives", *Liebigs Ann. Chem.*, 659, 64–80 (1962)—with English language abstract from *Chem Abs.*, 58, Abstract No. 58:8923d (1962).

R. Gleiter et al., "Vicinal Pentaketones", *Angew. Chem. Int. Ed. Engl.*, 25, 999 (1986).

B.D. Grant et al., "Deep UV Photoresists I. Meldrum's Diazo Sensitizer", *IEEE Transactions on Electron Devices, ED–28*, 1300–1305 (Nov. 1981).

G. Gray et al. in *Liquid Crystals and Plastic Crystals*, vol. 1; Wiley: New York, 1974—Title Page, Copyright Page and Table of Contents Only.

*International Critical Tables of Numerical Data, Physic, Chemistry and Technology*, vol. III; McGraw–Hill: New York; 1928—Title Page, Copyright Page and Table of Contents Only.

T.E. Jordan in *Vapor Pressure of Organic Compounds*; Interscience: New York; 1954—Title Page, Copyright Page and Table of Contents Only.

S. Kammula et al., "Intramolecular Decomposition of Isopropylidene Diazomalonate (Diazo Meldrum's Acid)", *J. Org. Chem.*, 42, 2931–2932 (1977).

S. Klosky et al., "The Vapor–Pressure Curve of Benzoic Acid", *J. Am. Chem. Soc.*, 49, 1280–1284 (1927).

G. Krien, "Thermoanalytische Untersuchungen an Rauchfarbstoffen", *Thermochim. Acta*, 81, 29–43 (1984).

M. Matsuoka in *Infrared Absorbing Materials*; Plenum Press: New York (1990)—Title page, Copyright page and Table of Contents only.

M. Matsuoka in *Absorption Spectra of Dyes for Diode Lasers, JOEM Handbook 2*; Bunshin Publishing: Tokyo (1990)—Title Page, Copyright Page and Table of Contents only.

F.S. Mortimer et al., "The Vapor Pressures of Some Substances Found in Coal Tar", *Ind. Eng. Chem.*, 15, 1140–1142 (1923).

W.A. Noyes, Jr. et al., "The Vapor Pressure of Anhydrous oxalic Acid", *J. Am. Chem. Soc.*, 48, 1882–1887 (1926).

*Pigment Handbook*; John Wiley & Sons: New York; vols. 1–3 (1988)—title page, copyright page and table of contents only.

M.R. Porter in *Handbook of Surfactants*; Blackie & Son: Glasgow (1991)—title page, copyright page and table of contents only.

M. Postel et al., "Plastic Phases in Globular Phosphorus Compounds. A New Structural Criterion for Plastic Behaviour", *J. Phys. Chem.*, 81, 2634–2637 (1977).

W. Ramsay et al., "On the Vapour–pressures of Bromine and Iodine, and on Iodine Monchloride", *J. Chem. Soc.*, 49, 453–462 (1886).

M.W. Ranney in *Silicones*; Noyes Data: Park Ridge, NJ; vols. 1 and 2 (1977)—Title Page, Copyright Page and Table of Contents only.

Y. Rao et al., "A Simple Procedure for Preparation of α–Diazocarbonyl Compounds", *Indian J. Chem.*, 25B, 735–737 (Jul. 1985).

M. Regitz, "New Methods of Preparative Organic Chemistry", *Angew. Chem. internatl. Edit.*, 6, 733–749 (1967).

M. Regitz, "Reaction of active methylene compounds with azides. I. New synthesis of α–diazo–β–dicarbonyl compounds from benzene–sulfonyl azides and β–diketones", *Liebigs Ann. Chem.*, 676, 101–109 (1964)—with English language abstract from *Chem Abs.*, 61, Abstract 61:14595c (1964).

M. Regitz et al., "Reactions of CH–active compounds and azides. XXIV. Multiple diazo group transfer to carbonyl–activated di–and tetramethylene compounds", *Chem. Ber.*, 102, 1743–1754 (1969)—with English language abstract from *Chem. Abs.*, 71, Abstract No. 71:12749e (1979).

M. Regitz et al. in *Diazo Compounds, Properties and Synthesis*; Academic Press: New York; Table 2.2, Table 2.3, and pages 88–89 (1986).

Roth et al. in *Landolt–Bornstein Physikalischchemische Tabellen*, vol. 2, Part 2a; Springer–Verlag: Berlin, 1960—Title Page, Copyright Page, and Table of Contents only.

Schulze et al., "Thermodynamic Properties of the Structural Analogues Benzo[c]cinnoline, Trans–Azobenzene, and Cic–azobenzene", *Z. Phys. Chem (Neue Folge)*, 107, 1–19 (1977).

G.W. Sears et al., "Vapor Pressures of Naphthalene, Anthracene and Hexachlorobenzene in a Low Pressure Region", *J. Am. Chem. Soc.*, 71, 1632–1634 (1949).

T.K. Sherwood et al., "The Maximum Rate of Sublimation of Solids", *AIChE J.*, 8, 590–593 (Nov. 1962).

L.A.K. Stavely, "Phase Transitions in Plastic Crystals", *Ann. Rev. Phys. Chem.*, 13, 351–368 (1962).

R.M. Stephenson et al. in *Handbook of the Thermodynamics of Organic Compounds*; Elsevier, New York, 1987—Title Page, Copyright Page, and Table of Contents only.

D.R. Stull, "Vapor Pressure of Pure Substances Organic Compounds", *Ind. Eng. Chem.*, 39, 517–550 and 1684 (1947).
T.H. Swan et al., "Vapor Pressure of Organic Crystals by an Effusion Method", *J. Am. Chem. Soc.*, 47, 2112–2116 (1925).
J. Timmermans in *Physico–Chemical Constants of Pure Organic Compounds*, vol. 2; Elsevier: New York; 1965—Title Page, Copyright Page, and Table of Contents only.
J. Timmermans, "Plastic Crystals: A Historical Review", *J. Phys. Chem. Solids*, 18, 1–8 (1961).
W.A. Tolbert et al., "High–Speed Color Imaging by Laser Ablation Transfer with a Dynamic Release Layer: Fundamental Mechanisms", *J. Imaging Sci. Technol.*, 37, 411–421 (Jul./Aug. 1993).
E. Vanstone, "The Vapour Pressures of Two Perfectly Miscible Solids and their Solid Solutions", *J. Chem. Soc.*, 429–443 (1910).
K. Venkataraman in *The Chemistry of Synthetic Dyes*; Academic Press: New York; vols. 1–4 (1952, 1970, and 1971)—title page, copyright page and table of contents only.

LASER-INDUCED MASS TRANSFER IMAGING MATERIALS AND METHODS UTILIZING COLORLESS SUBLIMABLE COMPOUNDS

FIELD OF THE INVENTION

This invention relates to the field of thermally imageable materials, specifically for laser induced thermal imaging. In particular, this invention pertains to the method of improving sensitivity in laser induced thermal imaging using sublimable compounds. The method is useful in the production of color proofs, printing plates, films, printed circuit boards, and other graphic arts media that use thermal transfer imaging methods.

BACKGROUND OF THE INVENTION

Laser induced thermal imaging has long been used in the production of printing plates, image setting films, and proofing materials that require only dry processing. One type of laser imaging involves thermal transfer of material from donor to receptor. This is a complex non-equilibrium process, believed to involve both softening and thermal degradation of the material undergoing transfer, as discussed in Tolbert, W. A. et al., *J. Imaging Sci. Technol.*, 37, 411 (1993). Thermal degradation leads to gas production, and expansion of the gas may propel the remaining material to a receptor (ablation) or cause delamination from the donor substrate. Softening of the material permits adhesion of the material to the receptor. Thus the process may involve an ablation mechanism, a melt-stick mechanism, or both in combination.

Specifically, infrared light which has been generated by a laser is first absorbed by an infrared absorbing material (e.g., infrared dyes, black alumina, carbon black) and then converted to heat to partly decompose the material to be transferred. Imaging occurs on typical time scales of microseconds to nanoseconds, and can involve heating rates of 1 billion° C./second or more, peak temperatures of 600° C. and above, and gas pressures in excess of 100 atmospheres (10 MPa). Highly responsive materials are, therefore, required to provide low imaging thresholds. Prior art materials of this kind include polycarbonates, polyesters, and polyurethanes of tertiary diols of as disclosed in U.S. Pat. No. 5,156,938 Foley et al.), which undergo acid-catalyzed thermal cleavage of the polymer backbone. This patent also describes the use of diols, among them 2,5-dimethyl-3-hexyne-2,5-diol, which function in conjunction with an infrared absorber to produce an acid catalyst. Other prior art materials are "energetic compounds" such as nitrocellulose, exemplified in the same patent, and azide polymers such as those described in U.S. Pat. Nos. 5,278,023 (Bills et al.) and 5,308,737 (Bills et al.). The decomposition of energetic materials is exothermic and the released energy is believed to accelerate further decomposition.

Prior art materials are, however, not fully satisfactory, for example with respect to sensitivity at high imaging speeds or, as in the case of azide polymers, incompatibility with a number of infrared dyes. Thus, a need exists for other compounds that will lower the threshold for imaging, increase sensitivity, and are useable with a wide variety of infrared dyes.

SUMMARY OF THE INVENTION

In accordance with the present invention, the sensitivity of laser induced thermal imaging systems can be increased by using sublimable compounds. Such compounds do not sublime readily at room temperature but sublime significantly at higher temperatures, making them particularly suitable for laser induced thermal imaging systems.

One embodiment of the invention is a thermal transfer donor element comprising a substrate having coated on at least a portion thereof, in one or more layers: (a) a sublimable compound; (b) a radiation absorber; and (c) a thermal mass transfer material; wherein the sublimable compound is free of acetylenic groups.

The sublimable compound has a 5% mass loss temperature of at least about 55° C. and a 95% mass loss temperature of no more than about 200° C. at a heating rate of 10° C./minute under a nitrogen flow of 50 ml/minute, and it has a melting point temperature that is at least about the 5% mass loss temperature and a peak thermal decomposition temperature that is at least about the 95% mass loss temperature.

Another embodiment of the present invention is a thermal transfer system comprising the thermal transfer donor element listed above and an image-receiving element. This can be used in a process for forming an image comprising the steps of: (a) bringing the thermal transfer donor element into contact with an image-receiving element; and (b) imagewise exposing the construction of (a), thereby transferring the thermal mass transfer material of the thermal transfer donor element to the image-receiving element.

Sublimable compounds useful in this invention are substantially colorless. "Substantially colorless" means that in the image formed from the thermal transfer donor element, the sublimable compound contributes an optical density of no more than about 0.3 between 450 nm and 500 nm, and no more than about 0.2 from 500 nm to 700 nm.

DETAILED DESCRIPTION OF THE INVENTION

Laser-addressable thermal transfer materials for producing color proofs, printing plates, films, printed circuit boards, and other media are provided. The materials contain a substrate on which is coated a light-to-heat converting composition. This composition includes a layer containing a sublimable material. Within this layer, or in a separate layer or layers is a radiation absorber and a thermal mass transfer material. The thermal mass transfer material, which can contain, for example, pigments, toner particles, resins, metal particles, monomers, polymers, dyes, or combinations thereof, can be incorporated into the layer containing the sublimable compound or into an additional layer coated onto the layer containing the sublimable compound. The radiation absorber can be employed in one of these layers or in a separate layer to achieve localized heating with an electromagnetic energy source, such as a laser, which causes the thermal mass transfer material to be transferred to the receptor, for example.

Sublimable Compounds

It is preferred that the sublimable compound of this invention has a 5% mass loss temperature that is at least about 55° C., more preferably at least about 60° C., and most preferably at least about 70° C. when it is heated at 10° C./minute under a nitrogen flow of 50 ml/minute. It is also preferred that the sublimable compound have a temperature for 5% mass loss of no more than 140° C., more preferably no more than about 125° C., and most preferably no more than about 110° C. It is further preferred that the sublimable compound have a 95% mass loss temperature that is no more than about 200° C., more preferably no more than about 180° C., and most preferably no more than about 165° C. when the sublimable compound is heated at 10° C./minute under a nitrogen flow of 50 ml/minute. It is also preferred for the sublimable compound to have a melting point at least about the 5% mass loss temperature and a peak thermal decomposition temperature that is at least about the 95% mass loss temperature.

The term sublimation is used rather loosely in the patent literature. Often, the term is used only to mean that a normally solid material becomes unusually mobile and can be transferred from one location to another, without regard to the actual state of the material under the transfer conditions. Properly, however, sublimation describes the process by which a substance in the solid state transforms directly into a gaseous state without first undergoing melting to the liquid state. This proper meaning is intended when the term sublimable or sublimation is used to describe the materials of this invention. The transformation may be accomplished by raising the temperature or lowering the pressure to which the material is exposed. According to the Gibbs phase rule, there is a single temperature and pressure characterizing the triple point of a pure substance at which solid, liquid, and gas are simultaneously in equilibrium. Thus, when the pressure at the triple point is above atmospheric pressure and the solid is heated, the solid passes directly into the gas phase without melting. It is, therefore, completely sublimable at atmospheric pressure. However, when the pressure at the triple point is below atmospheric pressure, the heated solid first melts to a liquid and, if the temperature is further increased, subsequently boils to form a gas. Such a material is not completely sublimable at atmospheric pressure. Nonetheless, when the triple point pressure is not too far below atmospheric the solid exhibits high vapor pressure. Thus, during heating, significant amounts of solid are lost by sublimation prior to melting. As used to describe the materials of this invention, the term sublimable refers to substances whose triple point pressure is either above or below normal atmospheric pressure. It has been found, however, that not all sublimable materials are suited for the practice of this invention and that, further, useful materials can be characterized by their sublimation properties as determined by thermogravimetric analysis (TGA) in conjunction with differential scanning calorimetry (DSC). It is believed that sublimation underlies the effectiveness of the materials of this invention in reducing the imaging threshold of constructions of which they are a part. Nonetheless, the inventors do not wish to be bound by any particular mechanism for this effect, noting only that the sublimation properties of the pure sublimable substances of the invention are the method by which usefully effective materials are selected.

In the TGA a known mass (e.g., 2–5 mg) of sublimable material is heated at a constant rate of 10° C./minute under a nitrogen flow of 50 ml/minute (at standard temperature and pressure, i.e., 25° C. and 1 atmosphere) and the percentage of the initial mass lost is monitored as a function of the temperature. To confirm that the mass loss is due to sublimation and not, for instance, to thermal decomposition, a DSC experiment is performed. The same sublimable material (e.g., 1–5 mg) is placed in a DSC pan, which is sealed with a cap to prevent material loss by sublimation. The pan is then heated at a constant rate of 10° C./minute and the flow of heat into and out of the pan is monitored. The material is deemed sublimable if: (1) it does not melt at a temperature lower than that required for 5% mass loss in the TGA experiment; and (2) there are no exothermic or endothermic peaks associated with decomposition at a temperature below that for 95% mass loss in the TGA experiment. Melting of a pure compound is associated with a single sharp endothermic peak in the DSC measurement. Because a sealed pan is used during the DSC experiment, the pressure within the pan will increase above atmospheric as the temperature is raised. This leads to the observation of a sharp melting endotherm for materials which completely sublime and do not melt under normal atmospheric pressure. The observation of a such a melting endotherm does not disqualify the material from being characterized as sublimable, provided the endotherm occurs above the temperature for 5% mass loss measured with TGA. It is also possible that, at the heating rates employed in the TGA experiment, some materials may not establish a sublimation equilibrium and so may melt, even though in an equilibrium situation the material would sublime entirely without melting. Such materials are also deemed sublimable if the melting temperature is above that for 5% mass loss by TGA. Endotherms associated with transition from one crystal form to another may also be observed, but since these occur below the melting point they do not affect the definition of sublimability.

In the TGA experiment, the temperatures for 5% mass loss and for 95% mass loss are used to characterize the sublimable material. The temperature dependence of the vapor pressure of a solid is usually well described by the Antoine equation $\log P=A+B/T$ in which P is the vapor pressure, T is the absolute (Kelvin) temperature, and A and B are constants characteristic of the particular substance. B is a negative number, reflecting the increase in vapor pressure with increase in temperature. When the Antoine constants of a material are known, it has been found that the results of the TGA experiment can be well predicted using the Antoine equation. This provides an alternative basis for selection of effective sublimable materials. The TGA temperature at which 5% mass loss occurs is the temperature at which the Antoine equation predicts a vapor pressure of 308 Pascals, while the TGA temperature at which 95% mass loss occurs is the temperature at which the Antoine equation predicts a vapor pressure of 5570 Pascals. Other variants of the Antoine equation may be used, such as $\log P=A+B/(C+T)$ or $\log P=A+B/T+C \log T$, in which C is an additional constant characteristic of the substance.

Suitable compilations of Antoine constants are the following: Stephenson, R. M and Malanowski S., *Handbook of the Thermodynamics of Organic Compounds,* Elsevier, New York, 1987; Timmermans, J., *Physico-Chemical Constants of Pure Organic Compounds,* Vol. 2, Elsevier, New York 1965; *Landolt-Bornstein Physikalischchemische Tabellen,* Vol. 2, Part 2a, Springer-Verlag, Berlin, 1960; Jordan, E. T., *Vapor Pressure of Organic Compounds,* Interscience, New York, 1954; Timmermans, J., *Physico-Chemical Constants of Pure Organic Compounds,* Elsevier, New York, 1950; Stull, D. R., *Ind Eng. Chem.,* 39, 517, 1684 (1947); and *International Critical Tables,* Vol. 3, McGraw-Hill, New York, 1928. Additional references which are also useful are: Cox, I. D. and Pilcher, G., *Thermochemistry of Organic and Organometallic Compounds,* Academic Press, New York, 1970; Sears, G. W. and Hopke, E. R., *J. Am. Chem. Soc.,* 71, 1632 (1949); Coolidge, A. S. and Coolidge, M. S., ibid, 49, 100 (1927); Klosky, S. et al., ibid, 49, 1280 (1927); Noyes, Jr., W. A. and Wobbe, D. E., ibid, 48, 1882 (1926); Swan, T. H. and Mack, Jr., E., ibid, 47, 2112 (1925); Bradley, R. S. and Cleasby, T. G., *J. Chem. Soc.,* 1681 (1953); Bradley, R. S. and Cotson, S., ibid., 1684 (1953); Bradley, R. S. and Care, A. D., ibid, 1688 (1953); Bradley, R. S. and Cleasby, T. G., ibid, 1690 (1953); Vanstone, E., ibid, 97, 429 (1910); Ramsay, W. and Young, S., ibid, 49, 453 (1886); Davies, M.

et al., *Trans. Faraday Soc.*, 55, 1100 (1959); Davies, M. and Jones, A. H., ibid, 55, 1329 (1959); Davies, M. and Jones, J. I., ibid, 50, 1042 (1954); Balson, E. W., ibid, 43, 54 (1947); Nelson, O. A., *Ind. Eng. Chem.*, 22, 971 (1930); Mortimer, F. S. and Murphy, R. V., ibid, 15, 1140 (1923); Schulze, F. -W. et al., *Z. Phys. Chem.* (*Neue Folge*), 107, 1 (1977); Cordes, H. and Cammenga, H., ibid., 45, 186 (1965); Sherwood, T. K. and Johannes, C., *AIChE J.*, 8, 590 (1962); Andrews, M. R., *J. Phys. Chem.*, 30, 1497 (1926); and Krien, G., *Thermochim. Acta*, 81, 29 (1984).

The selection of effective sublimable materials is generally not based on chemical structure or restricted to materials belonging to any particular chemical class, whether organic or inorganic. Instead, effective sublimable materials are selected on the basis of TGA measurements, or TGA behavior estimated with the Antoine equation as described above.

A nonlimiting list of sublimable materials includes materials such as 1,8-cyclotetradecadiyne; maleic anhydride; benzofurazan; fumaronitrile; chromium hexacarbonyl; 1-bromo-4-chlorobenzene; 1,4-diazabicyclo[2.2.2]octane; carbon tetrabromide; 1,2,4,5-tetramethylbenzene; octafluoronaphthalene; molybdenum hexacarbonyl; gallium(III) chloride; 4-methylpyridine trimethylboron complex; 4-chloroaniline; hexachloroethane; 2,5-dimethylphenol; 1,4-benzoquinone; 2,3-dimethylphenol; niobium(V) fluoride; 1,4-dibromobenzene; 1,3,5-trichlorobenzene; tungsten hexacarbonyl; adamantane; m-carborane; 4,4'-difluorobiphenyl; azulene; trans-syn-trans-tetradecahydroanthracene; N-(trifluoroacetyl)glycine; 1-hydroxy-2,2,6,6-tetramethyl-4-oxopiperidine; 2,2'-difluorobiphenyl; bromopentachloroethane; acetamide; biphenylene; 2,5-dimethyl-1,4-benzoquinone; 4-tert-butylphenol; pentafluorobenzoic acid; butyramide; 3-chloroaniline hydrochloride; aluminum(III) chloride; dimedone diazo; valeramide; cis-2-butenoic acid amide; 2,6-dimethylnaphthalene; 1-bromo-4-nitrobenzene; furan-2-carboxylic acid; 1,2-dibromotetrachloroethane; trimethylamine borontrifluoride complex; 2,3-dimethylnaphthalene; perfluorohexadecane; bis(cyclopentadienyl)manganese; tetracyanoethylene; succinic anhydride; tellurium(IV) fluoride; ferrocene; 1,2,3-trihydroxybenzene; thiophene-2-carboxylic acid; cyclohexyl ammonium benzoate; tris(2,4-pentanedionato)manganese(III); benzoic acid; dicyclohexyl ammonium nitrite; 1-adamantanol; 2-chloro-aniline hydrochloride; 1,8,8-trimethylbicyclo[3.2.1]octane-2,4-dione; o-carborane; tungsten(VI) oxochloride; phthalic anhydride; aniline hydrochloride; trans-2-pentenoic acid amide; salicylic acid; 1,4-diiodobenzene; dimethyl terephthalate; 2-adamantanone; trans-6-heptenoic acid amide; hexamethylbenzene; quinhydrone; 4-fluorobenzoic acid; niobium(V) chloride; molybdenum(V) chloride; [2.2]metacyclophane; trichloro-1,4-hydroquinone; pyrrole-2-carboxylic acid; trichloro-1,4-benzoquinone; oxalic acid; 2,6-dichloro-1,4-benzoquinone; 2-adamantanol; 2,4,6-tri-tert-butylphenol; penta-erythritol tetrabromide; tantalum(V) chloride; cis-1,2-cyclohexanediol; trans-1,2-cyclohexanediol; malonic acid; trans-2-hexenoic acid amide; (±)-1,3-diphenylbutane; tris(2,4-pentanedionato)cobalt(III); 4,4'-dichlorobiphenyl; hydroquinone; 1,4-dihydroxy-2,2,6,6-tetramethylpiperidine; phenazine; 2-aminobenzoic acid; tris(2,4-pentanedionato) vanadium(III); terephthalic acid monomethyl ester; 4-aminophenol; hexamethylene tetramine; and 4-methoxybenzoic acid.

The above materials include compounds whose triple points are either below or above atmospheric pressure. Compounds of the first kind include hexamethyl cyclotrisiloxane (triple point: 64° C., 8510 Pa), 1,4-dichlorobenzene (53° C., 1220 Pa) and camphor (180° C., 0.051 MPa). Hexachloroethane (187° C., 0.107 MPa) and adamantane (268° C., 0.482 MPa) have triple points above normal atmospheric pressure and sublime without melting unless confined under pressure.

Sublimable materials may come from any chemical class. Useful categories include one- or two-ring aromatic molecules such as benzene, naphthalene, and their derivatives; small hydrogen-bonded molecules such as acids, amides, and carbamates; fluorinated materials; and molecules of generally spherical shape such as carbon tetrabromide, hexachloroethane, metal carbonyls, carboranes, transition metal fluorides, adamantane, camphor, and the like. The materials with spherical molecules typically belong to the class of plastic crystals defined as having an entropy of fusion of less than 6 cal·$K^{-1}$ $mol^{-1}$ resulting from rotation or vibration of the molecules within the crystal. If high melting, these materials frequently exhibit high sublimation pressure. A variety of such plastic crystalline materials are described in Angell, C. A. et al., *J. Chim. Phys-Chim. Biol.*, 82, 773 (1985); Postel, M. and Riess, J. G., *J. Phys. Chem.*, 81, 2634 (1977); Gray, G. W. and Winsor, P. A., *Liquid Crystals and Plastic Crystals*, Vol. 1, Wiley, New York, 1974; Stavely, L. A. K., *Ann. Rev. Phys. Chem.*, 13, 351 (1962); Timmermans, J., *J. Phys. Chem. Solids*, 18, 1 (1961); and Dunning, W. J., ibid., 18, 21 (1961). Examples of suitable materials include benzene derivatives (benzene substituted with one or more halide, hydroxyl, amino, carboxyl, nitro group, etc.), naphthalene derivatives (naphthalene substituted with one or two allyl groups having 1–4 carbon atoms), biphenyl derivatives (biphenyl substituted with one or two halides), anhydrides of dicarboxylic acids having 4–8 carbon atoms, amides of carboxylic acids having 2–8 carbon atoms, carboxylic acids of the aliphatic, aromatic, and heteroaromatic type having 2–8 carbon atoms and optionally containing the heteroatoms O, S, N, fluorinated derivatives (generally of the formulae $C_nF_{n-2}$, $C_nF_n$, and $C_nF_{2n+2}$ where n=10–18), benzoquinone derivatives (benzoquinone substituted with one or more halide atoms or alkyl groups having 1–4 carbon atoms), perhaloethylenes (generally of the structure $C_2Cl_nBr_{6-n}$ where n=2–6), polycyclic derivatives (bicyclo or adamantane skeleton optionally including nitrogen atoms in the ring or rings and optionally substituted with halide atoms, allyl, hydroxy, alkoxy, amino, carboxy groups), and inorganic compounds (generally of the formulae $M(CO)_6$, $M(cyclopentadienyl)_2$, $M(acac)_3$, $MCl_5$, and $MF_6$ where M is a group 5–10 metal).

Other sublimable materials include diazo compounds such as those described in Grant, B. D. et al., *IEEE Trans. Electron Devices*, ED-28, 1300 (1981) and those in Applicants' Assignees U.S. patent application Ser. No. 08/627,160 entitled "Diazo Compounds for Laser-Induced Mass Transfer Imaging Materials," filed Apr. 3, 1996, which is incorporated herein by reference.

In order for a sublimable compound of this invention to be useful it must be neither excessively sublimable nor too poorly sublimable. On the one hand, if the temperature for 5% mass loss is below about 55° C. the compound is not useful since it can readily sublime out of the imaging layer during the coating, drying, and storage steps. This can be seen for the first two compounds of Example 1. Preferably, therefore, the temperature for 5% mass loss is at least about 60° C., and most preferably at least about 70° C.

On the other hand, a thermally stable sublimable compound which has low vapor pressure cannot contribute significantly to the rapid accumulation of pressure beneath or within an imaging layer during imagewise heating with a near IR laser. The temperature for 5% mass loss is, therefore, preferably no more than about 140° C., more preferably no more than about 125° C., and most preferably no more than about 110°.

Another indicator of whether the compound possesses sufficient vapor pressure is the temperature for 95% mass loss. This temperature is no more than about 200° C. for a useful substance. The exact upper bound on this temperature will depend on the power of the imaging laser, the dwell time for imaging and the spot size of the image. Factors which contribute to raising the temperature in the imaging layer, such as high power, long, but not excessive, dwell times and small spot size, should increase the permissible maximum temperature for 95% mass loss. Extremely long dwell times (greater than about 10 microseconds) can result in reduced temperatures owing to heat conduction losses. A preferred temperature for 95% mass loss is no more than about 180° C., and most preferably no more than about 165° C. The Examples will illustrate the preferred limits for 5% and 95% mass loss.

When a sublimable material is within the preferred limits, it is further desired that the substance undergo a very rapid change in vapor pressure on heating. For such a substance the B constant in the Antoine equation $\log P=A-B/T$ will be large. A large value is greater than about 3000 and, more favorably, greater than about 4000. Furthermore, the difference in temperatures for 5% and 95% mass loss will be small. In useful materials this difference is less than about 85° C., and preferably less than about 75° C. Most preferably the difference in these temperatures is 65° C. or less. This is also illustrated in the Examples.

Taking all of these factors into consideration, a preferred group of sublimable compounds include 2-diazo-5,5-dimethyl-cyclohexane-1,3-dione, camphor, naphthalene, borneal, butyramide, valeramide, 4-tert-butyl-phenol, furan-2-carboxylic acid, succinic anhydride, 1-adamantanol, 2-adamantanone.

Thermal Mass Transfer Materials

Thermal mass transfer materials are materials that can be removed from a substrate or donor element by the process of absorption of intense electromagnetic radiation. Depending on the intensity of the light, light to heat conversion within or adjacent to the materials can cause a melting of the materials and/or gas production within or adjacent to them. Gas production may be the result of evaporation, sublimation, or thermal decomposition to gaseous products. Expansion of the gas may cause delamination from the donor substrate or propulsion of material from the donor to a receptor. The latter process is often termed ablation. Melting or softening of the material promotes adhesion to the receptor. The overall transfer process thus involves ablative or melt-stick transfer or a combination of the two.

Thermal mass transfer materials suitable for use in the present invention are materials that can undergo a light-induced thermal mass transfer from the thermal transfer donor element. Typically, these are materials that can be transferred to an image-receiving element in an imagewise fashion. Depending on the desired application, the thermal mass transfer material can include one or more of the following: dyes; metal particles or films; selective light absorbers such as infrared absorbers and fluorescing agents for identification, security and marking purposes; pigments; semiconductors; electrographic or electrophotographic toners; phosphors such as those used for television or medical imaging purposes; electroless plating catalysts; polymerization catalysts; curing agents; and photoinitiators.

For color transfer printing a dye is typically included in the thermal mass transfer material. Suitable dyes include those listed in Venkataraman, K., *The Chemistry of Synthelic Dyes*, Vols. 1–4, Academic Press, 1970 and *The Colour Index*, Vols. 1–8, Society of Dyers and Colourists, Yorkshire, England. Examples of suitable dyes include cyanine dyes (e.g., streptocyanine, merocyanine, and carbocyanine dyes), squarylium dyes, oxonol dyes, anthraquinone dyes, diradical dicationic dyes (e.g., IR-165), and holopolar dyes, polycyclic aromatic hydrocarbon dyes, etc. Similarly, pigments can be included within the thermal mass transfer material to impart color and/or fluorescence. Examples are those known for use in the imaging arts including those listed in the *Pigment Handbook*, Lewis, P. A., Ed., Wiley, New York, 1988, or available from commercial sources such as Hilton-Davis, Sun Chemical Co., Aldrich Chemical Co., Imperial Chemical Industries, etc.

For the manufacture of electrical circuit elements (e.g., conductors, resistors, conductive adhesives, etc.) and the encapsulation of electronic components, it may be desirable to incorporate materials such as metal or metal oxide particles, fibers, or films within the thermal mass transfer material. Suitable metal oxides include titanium dioxide, silica, alumina, and oxides of chromium, iron, cobalt, manganese, nickel, copper, zinc, indium, tin, antimony and lead, and black alumina. Suitable metal films or particles can be derived from atmospherically stable metals including, but not limited to, aluminum, scandium, titanium, vanadium, chromium, manganese, iron, cobalt, nickel, copper, zinc, gallium, germanium, yttrium, zirconium, niobium, molybdenum, ruthenium, rhodium, palladium, silver, cadmium, indium, tin, antimony, lanthanum, gadolinium, hafnium, tantalum, tungsten, rhenium, osmium, iridium, platinum, gold, thallium, and lead, and alloys or mixtures thereof. Semiconductors can also be included within the thermal mass transfer material. Suitable semiconductors include carbon (including diamond or graphite), silicon, arsenic, gallium arsenide, gallium antimonide, gallium phosphide, aluminum antimonide, indium tin oxide, zinc antimonide, bismuth etc.

It is often desirable to transfer thermal mass transfer materials to a substrate to provide a modified surface (for example, to increase or decrease adhesion or wetability) in an imagewise fashion. For those applications, the transfer materials can include polymers or copolymers such as silicone polymers as described by Ranney, M. W., *Silicones*, Vols. 1 and 2, Noyes Data Corp., 1977. Other such materials that can be used include fluorinated polymers, polyurethanes, acrylic polymers, epoxy polymers, polyolefins, styrene-butadiene copolymers, styrene-acrylonitrile copolymers, polyethers, polyesters, acetals or ketals of polyvinyl alcohol, vinyl acetate copolymers, vinyl chloride copolymers, vinylidine chloride copolymers, cellulosic polymers, condensation polymers of diazonium salts, and phenolic resins such as novolac resins and resole resins.

In other applications it is desirable to transfer curable materials such as monomers or uncured oligomers or crosslinkable resins. In those applications the thermal mass transfer material may be a polymerizable monomer or oligomer. The properties of the material should be selected so that volatility of the monomer or oligomer is minimal to avoid storage problems. Suitable polymerizable materials include acrylate- or epoxy-terminated polysiloxanes, polyurethanes, polyethers, epoxides, etc. Suitable thermal crosslinkable resins include isocyanates, melamine formaldehyde resins, etc. Polymerizable and/or crosslinkable, transferrable binders are particularly valuable for the manufacture of filter arrays for liquid crystal devices, in which the color layer must resist several subsequent aggressive treatment steps.

If the thermal mass transfer elements of the present invention are multilayer constructions, the thermal mass transfer material is in the outermost layer(s). Thus, not only is a one-layer construction possible that includes the thermal mass transfer material, the radiation absorber, and the sublimable compound, but each of these materials could be in a separate layer. Alternatively, any two of them could be combined in one layer and the third in a second layer. For example, the topcoat could include the thermal mass transfer material in one or more layers (e.g., a toner or pigment in an organic polymeric binder), and an underlying layer could include the sublimable compound and the radiation absorber. Thus, whether one or more layers are used, the only requirement is that the thermal mass transfer material be in the outermost layer or layers.

Radiation Absorbers

The radiation absorber is one that can be used to absorb radiation emitted from a high intensity, short duration, light source such as a laser. It serves to sensitize the thermal transfer donor element to various wavelengths of radiation, and to convert incident electromagnetic radiation into thermal energy. That is, the radiation absorber acts as a light-to-heat conversion (LTHC) element. It is generally desirable for the radiation absorber to be highly absorptive of the incident radiation so that a minimum amount (weight percent for soluble absorbers or volume percent for insoluble absorbers) can be used in coatings. Typically, the radiation absorber is a black body absorber or an organic pigment or dye that provides an optical density of about 0.2–3.0.

The amount of LTHC used in the construction will be chosen depending on efficiency of conversion of light into heat, the absorptivity of the LTHC at the exposure wavelength, and thickness or optical path length of the construction. It is preferred that no more than about 50% by weight of the LTHC be used, except when the LTHC is present in a separate layer, in which case amounts up to 100% may be used. A broad range of LTHCs can be employed and some nonlimiting examples follow.

Dyes are suited for this purpose and may be present in particulate form or preferably substantially in molecular dispersion. Especially preferred are dyes absorbing in the IR region of the spectrum. Examples of such LTHC dyes may be found in Matsuoka, M., *Infrared Absorbing Materials,* Plenum Press, New York, 1990, in Matsuoka, M., *Absorption Spectra of Dyes for Diode Lasers,* Bunshin Publishing Co., Tokyo, 1990, in U.S. Pat. Nos. 4,833,124 (Lum), 4,912,083 (Chapman et al.), 4,942,141 (DeBoer et al.), 4,948,776 (Evans et al.), 4,948,777 (Evans et al.), 4,948,778 (DeBoer), 4,950,639 (DeBoer), 4,952,552 (Chapman et al.), 5,023,229 (Evans et al.), 5,024,990 (Chapman et al.), 5,286,604 (Simmons), 5,340,699 (Haley et al.), 5,401,607 (Takiff et al.) and in European Patent No. 568,993 (Yamaoka et al.). Additional dyes are described in Bello, K. A. et al., *J. Chem. Soc., Chem. Commun.,* 452 (1993) and U.S. Pat. No. 5,360,694 (Thien et al.). IR absorbers marketed by American Cyanamid or Glendale Protective Technologies, Inc., Lakeland, Fla., under the designation CYASORB IR-99, IR-126 and IR-165 may also be used, as disclosed in U.S. Pat. No. 5,156,938 (Foley et al.). Further examples of LTHCs may be found in U.S. Pat. Nos. 4,315,983 (Kawamura et al.), 4,415,621 (Specht et al.), 4,508,811 (Gravesteijn et al.), 4,582,776 (Matsui et al.), and 4,656,121 (Sato et al.). In addition to conventional dyes, U.S. Pat. No. 5,351,617 (Williams et al.) describes the use of IR-absorbing conductive polymers as LTHCs. As will be clear to those skilled in the art, not all the LTHC dyes described will be suitable for every construction. Such dyes will be chosen for solubility in, and compatibility with, the specific polymer, sublimable material, and coating solvent in question.

Pigmentary materials may also be dispersed in the construction as LTHCs. Examples include carbon black and graphite, disclosed in U.S. Pat. Nos. 4,245,003 (Oruanski et al.), 4,588,674 (Stewart et al.), 4,702,958 (Itoh et al.), and 4,711,834 (Butters et al.), and British Patent No. 2,176,018 (Ito et al.), as well as phthalocyanines, nickel dithiolenes, and other pigments described in U.S. Pat. Nos. 5,166,024 (Bugner et al.) and 5,351,617 (Williams et al.). Additionally, black azo pigments based on copper or chromium complexes of, for example, pyrazolone yellow, dianisidine red, and nickel azo yellow are useful. Inorganic pigments are also valuable. Examples are disclosed in U.S. Pat. Nos. 5,256,506 Ellis et al.), 5,351,617 (Williams et al.), and 5,360,781 (Leenders et al.), for example, and include oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead or tellurium. Metal borides, carbides, nitrides, carbonitrides, bronze-structured oxides, and oxides structurally related to the bronze family (e.g. $WO_{2.9}$) are also of utility, as taught by U.S. Pat. No. 5,351,617 (Williams et al.).

When dispersed particulate LTHCs are used, it is preferred that the particle size be less than about 10 micrometers, and especially preferred that it be less than about 1 micrometer. Metals themselves may be employed, either in the form of particles, as described for instance in U.S. Pat. No. 4,252,671 (Smith), or as films coplanar and contiguous with the thermal mass transfer layer, as disclosed in U.S. Pat. No. 5,256,506 (Ellis et al.). Suitable metals include aluminum, bismuth, tin, indium, tellurium and zinc.

The thickness of such a coplanar LTHC layer will be selected using well-known principles of optics to provide a good compromise between the amount of IR radiation absorbed and the amount reflected. In the case of metallic films, partial oxidation of the film during deposition, sputtering or vapor coating, for example, can be helpful in increasing absorption and decreasing reflection. Semiconductors such as silicon, germanium or antimony are also of utility as LTHCs, as described, for example, in U.S. Pat. Nos. 2,992,121 (Francis et al.) and 5,351,617 (Williams et al.).

When the LTHC is used in a construction in which the color of the image is important, as in the case of a color proof for instance, attention should be paid to ensuring that the LTHC does not contribute undesirable background color to the image. This may be done by using as the LTHC a dyestuff, such as a squarylium dye, with a narrow absorption in the infrared and consequently little or no light absorption in the visible region. If background color is important, a larger range of LTHCs may be used when the LTHC is incorporated in a separate layer, typically between the substrate and the material to be transferred.

Optional Additives

A variety of other materials may also be incorporated in the thermal mass transfer element. Surfactants, in particular, may be of special importance because the incorporation of a surfactant (as described by Porter, M. R., *Handbook of Surfactants,* Blackie, Chapman and Hall, New York, 1991) can improve the imaging sensitivity of the construction. Preferred surfactants are of fluorochemical type as taught by European Patent No. 602,893 (Warner et al.). The surfactant may be incorporated in any of the layers of a thermal transfer donor element, but preferably it is included in the thermal mass transfer material of the top layer of the donor element in order to reduce cohesion. Nonlimiting examples of fluorochemical surfactants include that available under the trade designation FLUORAD from Minnesota Mining and Manufacturing Co. (St. Paul, Minn.).

Other additives conventional in the art can be included in the thermal mass transfer elements to enhance film-forming properties, transfer characteristics, etc. These include coating aids, emulsifiers, dispersing agents, defoamers, slip agents, viscosity-controlling agents, lubricants, plasticizers, UV absorbers, light stabilizers, optical brighteners, antioxidants, preservatives, antistats, and the like. Plentiful examples may be found in U.S. Pat. No. 5,387,687 (Scrima et al.). Fillers may be incorporated in the construction, as well as polymeric beads in the micrometer size range. This can be advantageous in preventing blocking when sheets of donor material are stacked on top of each other, or helpful in minimizing fingerprinting.

Any of the layers of the construction can also include an organic polymeric binder. Exemplary binders are listed above in the discussion of the thermal mass transfer materials. Other suitable binders include a wide variety of thermoplastic resins, thermosetting resins, waxes, and rubbers. They may be homopolymers and copolymers. Multiple materials may be present simultaneously as compatible blends, phase separated systems, interpenetrating networks and the like. Typically, these binders should be soluble or dispersible in organic solvents to aid in processing. Nonlimiting examples of such binders include olefinic resins, acrylic resins, styrenic resins, vinyl resins (including vinyl acetate, vinyl chloride, and vinylidine chloride copolymers), polyamide resins, polyimide resins, polyester resins, olefin resins, allyl resins, urea resins, phenolic resins (such as novolac or resole resins), melamine resins, polycarbonate resins, polyketal resins, polyacetal resins, polyether resins, polyphenylene oxide resins, polyphenylene sulfide resins, polysulfone resins, polyurethane resins, fluorine-containing resins, cellulosic resins, silicone resins, epoxy resins, ionomer resins, rosin derivatives, natural (animal, vegetable, and mineral) and synthetic waxes, natural and synthetic rubbers (e.g., isoprene rubber, styrene/butadiene rubber, butadiene rubber, acrylonitrile/butadiene rubber, butyl rubber, chloroprene rubber, acrylic rubber, chlorosulfonated polyethylene rubber, hydrin rubber, urethane rubber, etc.). Water dispersible resins or polymeric latexes or emulsions may also be used.

Thermal Transfer Donor Elements

The thermal mass transfer elements of the present invention include a substrate on which is coated at least one layer of material that includes a sublimable material as previously defined. This layer can also include a radiation absorber (i.e., a light-to-heat converter or LTHC). Multiple layers may, however, be used. If the thermal mass transfer elements of the present invention are multilayer constructions, the thermal mass transfer material is in the outermost layer(s). Thus, not only is a one-layer construction possible that includes the thermal mass transfer material, the LTHC, and the sublimable compound, but each of these materials could be in a separate layer.

Alternatively, any two of them could be combined in one layer and the third in a second layer. For example, the topcoat could include a toner or pigment in an organic polymeric binder as the thermal mass transfer material in one or more layers, and an underlying layer could include the sublimable compound and the LTHC. Thus, whether one or more layers are used, the only requirement is that the thermal mass transfer material be in the outermost layer(s). The thermal mass transfer material may itself comprise one or two layers, and in the latter case both the component layers of the mass transfer layer are transferred during the imaging process. For example, if the thermal mass transfer material has as its outermost layer a coating of adhesive, adhesion of the transferred coating to the receptor is promoted. This can be valuable if brittle or refractory materials must be transferred, or if it is not practical to apply an adhesion-promoting coating to the receiver element. Alternatively, the outermost layer(s) of the thermal mass transfer materials may contain colorants or reactive resins, while the layer just beneath the thermal mass transfer material can be used to limit bleeding or diffusion of the sublimable compound or the LTHC into the topmost layer, or to assist the release of the mass transfer layer from the donor during imaging.

The sublimable materials of this invention are not required to absorb at the wavelength of the imaging light. Indeed, the large extensive delocalized electronic system required for strong absorption of infrared light is inconsistent with a molecular size sufficiently small to provide a solid with usefully high vapor pressure as defined above. It is also, in general, undesirable for the sublimable compounds to absorb in the visible spectral region, since this would impart an unwanted color to the thermal mass transfer image. Furthermore, as illustrated in Krien, G., *Thermochim. Acta*, 81, 29 (1984), typical sublimable dyes exhibit significantly lower vapor pressures than the sublimable materials of this invention. For example, it was found that for 20 sublimable dyes used in colored smokes the minimum temperature for discernable weight loss ranged from 157° C. to 290° C. At these temperatures the dyes exhibited a vapor pressure of 35±28 Pa, or ten-fold lower than the 308 Pa associated with the 5% mass loss point in Example 1. This is a consequence of the molecular size required to develop a chromophoric system. It is preferred, therefore, that the sublimable compounds be substantially colorless, and quantitative color limits are given below.

Whether in one layer or separate layers, the sublimable compound, the radiation absorber and the thermal mass transfer material are present in amounts effective to provide a suitable image, printing plate, color proof, resist, conductive element, etc. Preferably, the sublimable compound is present in an amount of about 5–65% by weight of the total coating, the radiation absorber is present in an amount of about 5–50% by weight of the total coating, and the thermal transfer material is present in an amount of about 5–75% by weight of the total coating.

If the sublimable materials of this invention are incorporated in the thermal mass transfer layer, they are present in an amount from about 5% to about 65% by weight. Preferably, they are present in an amount of about 10% to 60% by weight, and most preferably in an amount from about 20% to 50% by weight. When the sublimable materials are present in a separate layer beneath the thermal mass transfer layer much larger amounts can be used, up to 100% by weight. A preferred range is from about 20% to 100% by weight. An optimal amount of sublimable material will be chosen based both on the resultant transfer efficiency and on the degree of color, if any, imparted to the final image.

The substrate or support to which the thermal mass transfer donor elements are applied may be rigid or flexible. The support can be reflective or non-reflective with respect either to the wavelength of imaging light (including the infrared) or to other wavelengths. The carrier for the donor may be opaque, transparent, or translucent. In the case of a transparent carrier, optical imaging may be either from the coating side or from the carrier side. Any natural or synthetic product capable of being formed into fabric, mat, sheet, foil, film or cylinder is suitable as a substrate. The substrate may thus be glass, ceramic, metal, metal oxide, fibrous materials, paper, polymers, resins, coated paper or mixtures, layers or laminates of such materials. Suitable donor substrates include sheets and films such as those made of plastic; glass; polyethylene terephthalate; fluorene polyester polymer consisting essentially of repeating interpolymerized units derived from 9,9-bis(4-hydroxyphenyl)fluorene and isophthalic acid, terephthalic acid or mixtures thereof; polyethylene; polypropylene; polyvinyl chloride and copolymers thereof; hydrolyzed and unhydrolyzed cellulose acetate. Preferably the donor substrate is transparent to the desired imaging radiation. However, any film that has sufficient transparency at the imaging wavelength and sufficient mechanical stability can be used. Nontransparent substrates which can be used include filled and/or coated opaque polyesters, aluminum supports, such as used in printing plates, and silicon chips. Prior to coating the thermal mass transfer layer or layers onto the substrate, the substrate may optionally be primed or treated (e.g. with a corona) to promote adhesion of the coating. The thickness of the substrates can vary widely, depending on the desired application. The donor material can be provided as sheets or rolls. Either of these can be single colored uniformly within the article, and multiple articles of different colors are used to produce a multi-colored image. Alternately, the donor materials could contain areas of multiple colors, with a single sheet or roll being used to generate multi-colored images.

The thermal transfer donor elements may be prepared by introducing the components into suitable solvents (e.g., tetrahydrofuran (THF), methyl ethyl ketone (MEK), toluene, methanol, ethanol, n-propanol, isopropanol, water, acetone, and that available under the trade designation DOWANOL from Dow Chemical Co. (Midland, Mich.), and the like, as well as mixtures thereof); mixing the resulting solutions at, for example, room temperature (i.e., 25°–30° C.); coating the resulting mixture onto the substrate; and drying the resultant coating, preferably at moderately elevated temperatures (e.g., 80° C.). The materials may be applied to a substrate with such suitable coating techniques as knife coating, roll coating, curtain coating, spin coating, extrusion die coating, gravure coating, spraying, etc.

When the thermal mass transfer material is a separate layer of a multilayer construction it may be coated by a variety of techniques including, but not limited to, coating from a solution or dispersion in an organic or aqueous solvent (e.g., bar coating, knife coating, slot coating, slide coating, etc.), vapor coating, sputtering, gravure coating, etc., as dictated by the requirements of the transfer material itself. In the case of a separate sublimable layer beneath the thermal mass transfer layer, this sublimable layer may be coated from a melt of the sublimable compound, provided that the latter has a triple point pressure below normal atmospheric pressure.

Preferably, the layer containing the sublimable compound has a thickness of about 0.1 micrometer to about 10 micrometers, more preferably about 0.2 micrometer to about 5 micrometers. The contribution of the layer containing the sublimable compound to the color of the final images is less than about 0.2, and preferably less than about 0.1, absorbance units in the spectral region from 500 nm to 700 nm and less than about 0.3, and preferably 0.2, absorbance units in the region between 450 and 500 nm. The thermal mass transfer material may optionally be highly colored and, when coated in a separate layer, this layer preferably has a thickness of about 0.1 micrometer to 10 micrometers, and more preferably about 0.3 micrometer to about 2 micrometers.

Imaging Process

The thermal transfer donor elements of the present invention are typically used in combination with an image-receiving element. Suitable image-receiving (i.e., thermal mass transfer-receiving) elements are well known to those skilled in the art. Nonlimiting examples of image-receiving elements which can be utilized in the present invention include anodized aluminum and other metals; transparent polyester films (e.g., PET); opaque filled and opaque coated plastic sheets; a variety of different types of paper (e.g., filled or unfilled, calendared, etc.); fabrics (e.g., leather); wood; cardboard; glass, including ITO-coated conductive glass; printed circuit board; semi-conductors; and ceramics. The image-receiving element can be untreated or treated to assist in the transfer or removal process or to enhance the adhesion of the transferred material. The receptor layer may also be pre-laminated to the donor as disclosed in U.S. Pat. No. 5,351,617 (Williams et al.). This may be useful when the image is formed on the donor itself, and the prelaminated receptor serves to contain and limit the spread of ablation debris. The image is, thus, created on the donor and the receptor is peeled and discarded.

When used with an image-receiving element in the practice of the present invention, the thermal transfer donor and receiving elements are brought into intimate contact with one another such that upon irradiation, the thermal mass transfer material is transferred from the donor element to the receiving element. For example, the donor and image-receiving elements can be held in intimate contact by vacuum techniques (e.g., vacuum hold-down), positive pressure, by the adhesive properties of the image-receiving element itself, or by prelamination, whereupon the thermal transfer receptor or, preferably, the donor element is image-wise heated. After transfer of the thermal mass transfer material from the donor to the image-receiving element an image is created on the image-receiving element and the donor element may be removed from the image-receiving element. Alternatively, the thermal transfer donor elements of the present invention can be used without an image-receiving element and simply ablated to provide an imaged article. In this case a peelable topcoat may be used to contain the ablated debris.

Thus, the donor elements of the present invention can be used in transfer printing, particularly color transfer printing for marking, bar coding and proofing applications. They can also be used in masking applications, in which the transferred image is an exposure mask for use in resists and other light sensitive materials in the graphic arts or printed circuit industry. For such applications, the thermal transfer material would include a material effective in blocking the light output from common exposure devices. Suitable such materials include curcumin, azo derivatives, oxadiazole derivatives, dicinnamalacetone derivatives, benzophenone derivatives, etc. Alternatively, the thermal transfer material could include a material capable of forming an etch resist, e.g. for a copper surface.

A donor including metal particles in an adhesive can be selectively transferred to a circuit board to act as a conductive adhesive in chip bonding. When smaller volume fractions of conductive particles, or alternatively semiconductive particles, in a binder are transferred, resistive circuit elements may be prepared.

The donor elements of the present invention can also be used in the manufacture of printing plates. Here, durability can be achieved by crosslinking the imaged material, for instance with a brief high-temperature bake. For example, the donor elements of the present invention can be used in the manufacture of waterless or lithographic printing plates. For lithographic printing plates, the transfer of oleophilic thermal transfer material to hydrophilic receptor such as grained, anodized aluminum is used. Preferably the thermal transfer material is transferred in an uncrosslinked state to maximize the sensitivity and resolution. The resulting printing plate can then be used for printing on a lithographic printing press using ink and fountain solution. Frequently, in order to increase the durability of the thermal transfer material after transfer, and thereby give a longer run-length printing plate, the thermal transfer material may contain crosslinking agents that crosslink the thermal transfer material upon application of heat or irradiation (e.g., UV). Examples of crosslinking agents that can be cured by the action of heat are melamine formaldehyde resins, such as that available under the trade designation CYMEL 303 from American Cyanamid Co., Wayne, N.J., in the presence of phenolic resins. Examples of crosslinking agents that can be cured by UV light are multifunctional acrylates such as that available under the trade designation SR-295 from Sartomer Co., Westchester, Pa. The thermal crosslinking can be enhanced by the presence of catalysts and curing agents such as acids. Likewise, photocrosslinking can be enhanced by the presence of photoinitiators, photocatalysts, and the like.

The donor elements of the present invention can also be used in the manufacture of color filters for liquid crystal display devices. An example of a suitable color donor element for making color filters would be a coating of dye or pigment in a binder on a substrate. A laser or other focused radiation source is used to induce the transfer of the color material in an imagewise manner, often to a matrix-bearing (e.g., a black matrix) receptor sheet. An imaging radiation absorbent material may be included within the dye/pigment layer. A separate imaging radiation layer may also be used, normally adjacent to the color containing donor layer. The colors of the donor layer may be selected as needed by the user from amongst the many available colors normally or specially used in filter elements, such as cyan, yellow, magenta, red, blue, green, white and other colors and tones of the spectrum as contemplated. The dyes or pigments are preferably transmissive of preselected specific wavelengths when transferred to the matrix bearing receptor layer.

Imaging of the thermal mass transfer media of this invention is accomplished by a light source of short duration. Short exposure minimizes heat loss by conduction, so improving thermal efficiency. Suitable light sources include flashlamps and lasers. It is advantageous to employ light sources which are relatively richer in infrared than ultraviolet wavelengths to minimize photochemical effects and maximize thermal efficiency. Therefore, when a laser is used it is preferred that it emit in the infrared or near infrared, especially from about 700 to 1200 nm. Suitable laser sources in this region include Nd:YAG, Nd:YLF and semiconductor lasers. The preferred lasers for use in this invention include high power (>100 mW) single mode laser diodes, fiber-coupled laser diodes, and diode-pumped solid state lasers (e.g. Nd:YAG, and Nd:YLF), and the most preferred lasers are diode-pumped solid state lasers.

The entire construction may be exposed at once, or by scanning, or with a pulsed source, or at successive times in arbitrary areas. Simultaneous multiple exposure devices may be used, including those in which the light energy is distributed using optic fibers. Single-mode laser diodes, fiber-coupled laser arrays, laser diode bars, and diode-pumped lasers producing 0.1–12 W in the near infrared region of the electromagnetic spectrum may be employed for exposure. Preferably, a solid state infrared laser or laser diode array is used. Sources of relatively low intensity are also useful, provided they are focused onto a relatively small area.

Exposure may be directed at the surface of the imaging construction containing sublimable materials, or through a transparent substrate beneath such a donor construction, or through the transparent substrate of a receiving layer substantially in contact with the donor construction. Whatever the method of thermally imaging the materials of this invention, it is evident that they may be integrally or locally preheated below the imaging temperature prior to or during imaging.

Exposure energies will depend on the type of transfer employed, for example on whether the image is formed directly by removing material from the construction or by transfer to a receptor element. When a receptor element is used, the exposure may depend on the degree of contact with the donor, the temperature, roughness, surface energy and the like of the receptor. The rate of scanning during the exposure may also play a role, as may the thermal mass of the donor or receptor. Exposure energies will be chosen to provide a degree of transfer and a transfer uniformity sufficiently great to be useful. Laser exposure dwell times are preferably about 0.05–50 microseconds and laser fluences are preferably about 0.01–1 $J/cm^2$. Though imaged with light sources, the materials of this invention are not essentially photosensitive to visible light. The thermal nature of the imaging process typically allows the imaging constructions to be handled under normal room lighting.

The invention will be further described by reference to the following detailed examples. These examples are offered to further illustrate the various specific and preferred embodiments and techniques. It should be understood, however, that many variations and modifications may be made while remaining within the scope of the present invention.

EXAMPLES

Unless otherwise specified, the materials employed below were obtained from Aldrich Chemical Co. (Milwaukee, Wis.). Melting points (uncorrected) were recorded using a Thomas-Hoover capillary meltingpoint apparatus available from Arthur H. Thomas Co. (Philadephia, Pa.). NMR spectra were recorded using either a 400 or 500 Mz Fourier Transform NMR Spectrometer available from Varian Instruments (Palo Alto, Calif.). Infrared spectra were recorded using a Bomem MB102 Fourier Transform IR Spectrometer available from Bomem/Hartmann & Braun (Quebec, Calif.).

For polymer molecular weight determination, gel permeation chromatography (GPC) analyses were recorded on a HP 1090 chromatograph with a HP 1047A refractive index detector available from Hewlett Packard Co. (Palo Alto, Calif.) and Jordi Associates mixed bed pore size and W-100 angstrom columns available from Jordi Associates, Inc. (Bellingham, Mass.). Calibration was based on polystyrene standards from Pressure Chem. Co. (Pittsburgh, Pa.). Samples were prepared in THF (4 mg/mL), filtered through a 0.2 micrometer TEFLON filter, followed by injection of sample (100 microliters).

Thermogravimetric analysis (TGA) and differential scanning calorimetry (DSC) measurements of materials were made using a DuPont Instruments 912 Differential Scanning Calorimeter and a 951 Thermogravimetric Analyzer. The TGA measurements were made using a heating rate of 10° C./minute under nitrogen flowing at a rate of 50 ml/minute (at standard temperature and pressure). They were used to determine the loss of sample mass during heating and, specifically, the temperatures for 5% and 95% mass loss. The DSC measurements were made at a heating rate of 10° C./minute in sealed stainless steel pans which could withstand several atmospheres of pressure without leaking. This procedure was particularly important in preventing loss of material by sublimation, boiling or decomposition. The DSC was used to determine melting point temperatures and the peak temperatures of any decomposition exotherms or endotherms. Sample sizes were 2–5 mg for TGA and 1–5 mg for DSC.

Three types of laser scanners were used: an internal drum type scanner suitable for imaging flexible substrates with a single beam Nd:YAG laser; a flat field system suitable for imaging both flexible and rigid substrates with a single beam Nd:YAG laser; and an external drum system suitable for imaging flexible substrates with a fiber-coupled laser diode array.

For the internal drum system, imaging was performed using a Nd:YAG laser, operating at 1.064 micrometers in $TEM_{00}$ mode and focused to a 26 micrometer spot ($1/e^2$) with 3.2 W of incident radiation at the image plane. The laser scan rate was 160 meters/second. Image data was transferred from a mass-memory system and supplied to an acousto-optic modulator which performed the imagewise modulation of the laser. The image plane consisted of a 135°-wrap drum which was translated synchronously perpendicular to the laser scan direction. The substrate (donor and receptor) was firmly attached to the drum during the imaging using a vacuum hold-down. The donor and the receptor were translated in a direction perpendicular to the laser scan at a constant velocity, using a precision translation stage.

For the flat field system, a flat-field galvanometric scanner was used to scan a focused laser beam from a d:YAG laser (1.064 micrometers) across an image plane. A precision translation vacuum stage was located at the image plane and was mounted in a motorized stage so that the material could be translated in the cross-scan direction. The laser power on the film plane was variable from 3–7 watts, and the spot size was about 200 micrometers ($1/e^2$ width). The linear scan speed for the examples cited here was 600 centimeters/second. Microscope glass slides were mounted on the vacuum stage and were used as the receiving substrate. A donor sheet was placed in vacuum contact with the glass and was imaged with the laser by exposure through the polyester side of the donor sheet. The donor and the receptor were translated in a direction perpendicular to the laser scan at a constant velocity. Consequently, colored stripes of equivalent dimensions were transferred to the glass in the imaged areas, since the beam from the laser was not modulated.

For the external drum system, the material was scanned with a focused laser spot from a collimated/circularized laser diode (SDL, Inc., San Jose, Calif., Model 5422-G1, 811 nanometers). An external drum scanning configuration was utilized. The focused spot size was 8 micrometers (full width at $1/e^2$ level), and the power at the imaging medium was 110 milliwatts. The cross-scan translation rate was 4.5 micrometers per drum rotation using a precision translation stage. The circumference of the drum was 84.8 centimeters. The receptor and the donor were attached to the drum using pressure sensitive adhesive tapes. Image data was transferred from a mass-memory system to the power supply, which performed the imagewise modulation of the laser diode.

EXAMPLE 1

The following table shows a comparison of experimentally measured temperatures with those computed from the Antoine equation using constants taken from the references cited in the specification:

| | | Temperature for 5% mass loss (°C.) | | Temperature for 95% mass loss (°C.) | |
|---|---|---|---|---|---|
| Compound | mp (°C.) | TGA expt. | Antoine eq. | TGA expt. | Antoine eq. |
| *hexamethylcyclotrisiloxane | 65 | <<30[a] | 16 | 62 | 59 |
| 1,4-dichlorobenzene | 55 | <45[b] | 38 | 68 | 74 |
| camphor | 177 | 59 | 58 | 119 | 117 |
| naphthalene | 81 | 68 | 72 | 115 | 117 |
| borneol | 208 | 74 | 78 | 126 | 131 |

[a]Upper limit because of very rapid weight loss (0.64%/°C.) at 23° C., the start of the TGA temperature ramp.
[b]Upper limit because of rapid weight loss (0.19%/°C.) at 28° C., the start of the TGA temperature ramp.

EXAMPLE 2

A nonlimiting list of sublimable materials is provided in the following table, with mass loss temperatures determined experimentally or from the Antoine equation:

| | mp | Temperature (°C.) for mass loss of: | |
|---|---|---|---|
| Compound | (°C.) | 5% | 95% |
| 1,8-cyclotetradecadiyne | 97 | 66 | 83 |
| maleic anhydride | 53 | 52 | 85 |
| benzofurazan | 55 | 48 | 87 |
| fumaronitrile | 96 | 51 | 90 |
| chromium hexacarbonyl | 85 | 47 | 92 |
| 1-bromo-4-chlorobenzene | 67 | 50 | 92 |
| 1,4-diazabicyclo[2.2.2]octane | 159 | 44 | 93 |
| carbon tetrabromide | 90 | 42 | 96 |
| 1,2,4,5-tetramethylbenzene | 81 | 55 | 96 |
| octafluoronaphthalene | 87 | 61 | 98 |
| molybdenum hexacarbonyl | 150 (dec) | 57 | 100 |
| gallium(III) chloride | 78 | 59 | 100 |
| 4-methylpyridine trimethylboron complex | 79 | 62 | 100 |
| 4-chloroaniline | 73 | 66 | 100 |
| hexachloroethane | 185 | 48 | 101 |
| 2,5-dimethylphenol | 72 | 68 | 105 |
| 1,4-benzoquinone | 117 | 61 | 106 |
| 2,3-dimethylphenol | 75 | 70 | 107 |
| niobium(V) fluoride | 79 | 76 | 110 |
| 1,4-dibromobenzene | 87 | 68 | 111 |
| 1,3,5-trichlorobenzene | 64 | 62 | 118 |
| tungsten hexacarbonyl | 150 (dec) | 75 | 119 |
| adamantane | 268 | 64 | 123 |
| m-carborane | 273 | 71 | 125 |
| 4,4'-difluorobiphenyl | 94 | 88 | 126 |
| azulene | 99 | 84 | 126 |
| trans-syn-trans-tetradecahydroanthracene | 87 | 87 | 126 |
| N-(trifluoroacetyl)glycine | 119 | 73 | 132 |
| 1-hydroxy-2,2,6,6-tetramethyl-4-oxopiperidine | 95 | 88 | 132 |
| 2,2'-difluorobiphenyl | 117 | 94 | 132 |
| bromopentachloroethane | 190 | 60 | 133 |
| acetamide | 81 | 78 | 133 |
| biphenylene | 110 | 104 | 133 |
| 2,5-dimethyl-1,4-benzoquinone | 125 | 88 | 134 |
| 4-tert-butylphenol | 100 | 91 | 134 |
| pentafluorobenzoic acid | 103 | 95 | 134 |
| butyramide | 116 | 88 | 136 |
| 3-chloroaniline hydrochloride | 222 | 87 | 137 |
| aluminum(III) chloride | 195 | 107 | 140 |
| 2-diazo-5,5-dimethylcyclohexane-1,3-dione | 108 | 93 | 141 |
| valeramide | 106 | 101 | 141 |
| cis-2-butenoic acid amide | 115 | 89 | 142 |
| 2,6-dimethylnaphthalene | 110 | 97 | 143 |

-continued

| Compound | mp (°C.) | Temperature (°C.) for mass loss of: 5% | 95% |
|---|---|---|---|
| 1-bromo-4-nitrobenzene | 127 | 101 | 143 |
| furan-2-carboxylic acid | 132 | 102 | 144 |
| 1,2-dibromotetrachloroethane | 221 | 77 | 145 |
| trimethylamine borontrifluoride complex | 143 | 91 | 145 |
| 2,3-dimethylnaphthalene | 104 | 99 | 146 |
| perfluorohexadecane | 115 | 110 | 148 |
| bis(cyclopentadienyl)manganese | 173 | 97 | 149 |
| tetracyanoethylene | 201 | 103 | 150 |
| succinic anhydride | 120 | 104 | 150 |
| tellurium(IV) fluoride | 129 | 91 | 152 |
| ferrocene | 173 | 96 | 152 |
| 1,2,3-trihydroxybenzene | 133 | 110 | 152 |
| thiophene-2-carboxylic acid | 129 | 112 | 152 |
| cyclohexyl ammonium benzoate | 186 | 116 | 155 |
| tris(2,4-pentanedionato)manganese(III) | 150 (dec) | 105 | 156 |
| benzoic acid | 122 | 109 | 156 |
| dicyclohexyl ammonium nitrite | 180 | 115 | 156 |
| 1-adamantanol | 247 | 97 | 158 |
| 2-chloroaniline hydrochloride | 235 | 107 | 158 |
| 1,8,8-trimethylbicyclo[3.2.1]octane-2,4-dione | 223 | 93 | 160 |
| o-carborane | 296 | 84 | 161 |
| tungsten(VI) oxochloride | 309 | 109 | 161 |
| phthalic anhydride | 131 | 116 | 162 |
| aniline hydrochloride | 198 | 117 | 163 |
| trans-2-pentenoic acid amide | 148 | 92 | 164 |
| salicylic acid | 161 | 114 | 165 |
| 1,4-diiodobenzene | 129 | 103 | 166 |
| dimethyl terephthalate | 141 | 121 | 166 |
| 2-adamantanone | 257 | 94 | 167 |
| trans-6-heptenoic acid amide | 125 | 124 | 167 |
| hexamethylbenzene | 166 | 116 | 168 |
| quinhydrone | 171 | 121 | 168 |
| 4-fluorobenzoic acid | 183 | 122 | 168 |
| niobium(V) chloride | 205 | 119 | 169 |
| molybdenum(V) chloride | 194 | 116 | 170 |
| [2.2]metacyclophane | 135 | 124 | 170 |
| trichloro-1,4-hydroquinone | 137 | 128 | 170 |
| pyrrole-2-carboxylic acid | 209 (dec) | 135 | 170 |
| trichloro-1,4-benzoquinone | 169 | 124 | 172 |
| oxalic acid | 190 | 128 | 172 |
| 2,6-dichloro-1,4-benzoquinone | 121 | 114 | 173 |
| 2-adamantanol | 263 | 117 | 173 |
| 2,4,6-tri-tert-butylphenol | 131 | 124 | 173 |
| pentaerythritol tetrabromide | 161 | 124 | 173 |
| tantalum(V) chloride | 220 | 129 | 174 |
| cis-1,2-cyclohexanediol | 98 | 88 | 178 |
| trans-1,2-cyclohexanediol | 104 | 86 | 178 |
| malonic acid | 136 (dec) | 119 | 178 |
| trans-2-hexenoic acid amide | 125 | 107 | 182 |
| (±)-1,3-diphenylbutane | 295 | 124 | 183 |
| tris(2,4-pentanedionato)cobalt(III) | 220 ±20 | 126 | 184 |
| 4,4'-dichlorobiphenyl | 149 | 140 | 184 |
| hydroquinone | 172 | 141 | 185 |
| 1,4-dihydroxy-2,2,6,6-tetramethylpiperidine | 158 | 141 | 186 |
| phenazine | 176 | 100 | 187 |
| 2-aminobenzoic acid | 149 | 143 | 188 |
| tris(2,4-pentanedionato)vanadium(III) | 187 | 99 | 190 |
| terephthalic acid monomethyl ester | 230 | 128 | 190 |
| 4-aminophenol | 186 | 149 | 191 |
| hexamethylene tetramine | 280 | 135 | 195 |
| 2-methoxybenzoic acid | 184 | 156 | 201 |

EXAMPLE 3

A test coating solution was prepared and comprised:

| | |
|---|---|
| 20% by weight novolac resin SD-126A in MEK | 0.25 gm |
| IR-165 near infrared dye | 0.05 gm |
| Indolenine Red magenta dye (Color Index 48070) as its PECHS salt | 0.015 gm |

-continued

| | |
|---|---|
| Camphor | 0.05 gm |
| Methylethylketone (MEK) | 0.70 gm |

The novolac SD-126A resin was obtained from Borden Packaging & Industrial Products, Louisville, Ky. The IR-165 dye, which absorbs at the laser wavelength of 1.064 micrometers, was supplied by Glendale Protective Technologies, Lakeland, Fla., and has the structure:

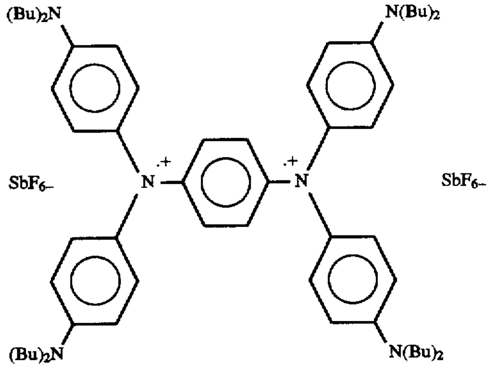

The Indolenine Red dye was used to help visualize the coating and the transferred image. It has the structure:

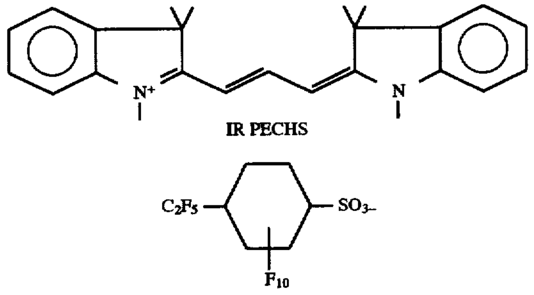

The PECHS, or perfluoro-4-ethylcyclohexane sulfonate, salt of Indolenine Red magenta dye was prepared by the metathesis reaction between Indolenine Red chloride and potassium perfluoro-4-ethylcyclohexane sulfonate in water as taught in U.S. Pat. No. 4,307,182 (Dalzell et al.).

Camphor was the sublimable compound.

A comparison coating solution was prepared in the same way, except that the camphor was replaced by a further 0.25 gm of the novolac SD-126A resin solution. The camphor-containing coating solution is referred to as the "test" sample.

Both solutions were coated onto 58 micrometer thick polyester with a No. 4 wire-wound coating rod (RD Specialties, Webster, N.Y.) and dried 2 minutes at 80° C. to give nontacky, transparent donor films. The donor films were contacted to 150-micrometer thick grained, anodized, and silicated aluminum printing plate receptors under vacuum in the internal drum exposure unit. These donor/receptor samples were then exposed through the polyester side of the donor sheets. After peeling the exposed donor sheet off the receptor, the widths of the transferred lines on the receptor were measured in micrometers, and the threshold energy for thermal mass transfer was calculated. The following results were obtained:

| Sample | Line width (micrometers) | Sensitivity (J/cm²) | Relative sensitivity |
|---|---|---|---|
| Test | 19.4 | 0.040 | 1.8 |
| Comparison | 13.2 | 0.073 | 1 |

Camphor melts at 177° C., and showed 5% mass loss at 59° C. and 95% mass loss at 119° C. by TGA. The difference in the two mass loss temperatures is 60° C. This material is sublimable as defined above and significantly improves laser thermal imaging sensitivity.

EXAMPLE 4

Test and comparison coatings were prepared as for Example 3, with the exception that camphor was replaced with 1,4-dichlorobenzene in the test sample. The coatings were imaged as in Example 3, with the following results.

| Sample | Line width (micrometers) | Sensitivity (J/cm²) | Relative sensitivity |
|---|---|---|---|
| Test | 12.6 | 0.077 | 0.95 |
| Comparison | 13.2 | 0.073 | 1 |

While 1,4-dichlorobenzene sublimes readily, its temperature for 5% mass loss is less than 45° C. as determined by TGA and lies outside the preferred range of the invention (Example 1). The slightly reduced sensitivity may be due to porosity caused by sublimation of the 1,4-dichlorobenzene out of the coating prior to the test.

EXAMPLE 5

Test and comparison coatings were prepared as for Example 3, with the exception that camphor was replaced with naphthalene in the test sample. The coatings were imaged as in Example 3, except that line widths were measured on the donor rather than the receptor. The following results were obtained.

| Sample | Line width (micrometers) | Sensitivity (J/cm²) | Relative sensitivity |
|---|---|---|---|
| Test | 15.5 | 0.061 | 1.4 |
| Comparison | 10.8 | 0.087 | 1 |

Naphthalene melts at 81° C. and TGA shows it to lose 5% of its mass at 68° C. and 95% at 115° C. The difference between the two mass loss temperatures is 47° C. Naphthalene enhances the sensitivity of the imaging construction.

EXAMPLE 6

Test and comparison coatings were prepared as for Example 3, with the exception that camphor was replaced with 1,8,8-trimethylbicyclo[3.2.1]octane-2,4-dione in the test sample. The bicyclic compound was prepared as described in Eistert, B. et al., *Liebigs Ann. Chem.*, 659, 64 (1962). The coatings were imaged as in Example 3, with the following results.

| Sample | Line width (micrometers) | Sensitivity (J/cm²) | Relative sensitivity |
|---|---|---|---|
| Test | 19.0 | 0.042 | 1.2 |
| Comparison | 17.6 | 0.049 | 1 |

1,8,8-Trimethylbicyclo[3.2.1]octane-2,4-dione melts at 223° C. TGA shows that this material loses 5% of its mass at 93° C. and 95% of its mass at 160° C., a difference in temperatures of 67° C. This sublimable compound improves imaging sensitivity, but is not as effective as camphor or naphthalene. The latter two compounds have lower temperatures for 95% mass loss and a smaller range between 5% and 95% mass loss temperatures.

EXAMPLE 7

Test and comparison coatings were prepared as for Example 3, with the exception that camphor was replaced with the materials listed in the table below. The sublimable material was again replaced with an equal weight of novolac to form the comparison sample. The coatings were imaged at a 160 meters/second scan rate as in Example 3 to give the following results.

| Compound | Relative sensitivity | mp (°C.) | Temperature for mass loss of: 5% | 95% |
|---|---|---|---|---|
| control | 1.0 | — | — | — |
| butyramide | 1.3 | 116 | 88 | 136 |
| 4-tert-butylphenol | 1.4 | 100 | 91 | 134 |
| 2-adamantanone | 1.6 | 257 | 94 | 167 |
| 1-adamantanol | 1.4 | 247 | 97 | 158 |
| furan-2-carboxylic acid | 1.4 | 132 | 102 | 144 |
| valeramide | 1.4 | 106 | 101 | 141 |
| salicylic acid | 1.1 | 161 | 114 | 165 |
| pentaerythritol tetrabromide | 1.2 | 161 | 124 | 173 |
| 2-aminobenzoic acid | 1.2 | 149 | 143 | 188 |

None of the listed compounds showed signs of thermal decomposition below 200° C. All the compounds reduced the threshold for imaging. However, compounds with a 5% mass loss temperature greater than about 110° C. were not as effective as those for which this temperature was lower. 2,5-Dimethyl-1,4-benzoquinone, 2,5-dimethylnaphthalene and 2,6-dimethylnaphthalene were also tested as sublimable compounds, but showed poor compatibility with this coating. Additionally, the comparison sample and the valeramide sample were imaged at a faster scan rate of 192 meters/second. The comparison sample gave uneven transfer at the higher scan speed, rendering a definitive evaluation of sensitivity difficult, though sensitivity was clearly reduced relative to that at a 160 meters/second scan rate. The sample with valeramide still transferred well, with a sensitivity at 192 meters/second which was 1.2 times that of the comparison sample at 160 meters/second. This indicates that sublimable materials can effectively promote transfer at high scan speeds, whereas in their absence the transfer may become limited by chemical kinetics.

EXAMPLE 8

Test and comparison coatings were prepared as for Example 3, with the exception that camphor was replaced with 2-diazo-5,5-dimethylcyclohexane-1,3-dione (commonly known as dimedone diazo) in the test sample.

This diazo compound was prepared by the method of Rao, Y. K. et al., *Indian J. Chem.*, 25B, 735 (1986) as follows.

A mixture of dimedone (2.8 gm, 20 mmol), dichloromethane (30 ml), and p-toluenesulfonyl azide (3.94 gm, 20 mmol) was cooled to 0° C. and then DBU (1,8-diazabicyclo[5.4.0]undec-7-ene, 4.48 gm, 30 mmol) was added dropwise. After the addition of DBU, the reaction mixture was stirred at room temperature for 15 minutes and then poured into a solution of 10% KOH (100 ml). The organic layer was separated and washed sequentially with 3N HCl (50 ml), deionized water (2×50 ml), and saturated aqueous sodium chloride solution (50 ml). The organic layer was dried using anhydrous magnesium sulfate, filtered, and concentrated to give an orange solid. The solid was purified by column chromatography on silica gel using petroleum ether/ethyl acetate (65:35) as the eluent to give 2.10 gm of dimedone diazo as a pale yellow solid (mp 108°–109° C.). $^1$H NMR (400 MHz, $CDCl_3$): δ 1.09 (s, 6H); 2.41 (s, 4H).

The comparison coating of Example 3, without sublimable compound, forms comparison coating 1 of the present Example. Comparison coating 2 was prepared from the following coating solution:

| | |
|---|---|
| Nitrocellulose | 0.10 gm |
| IR-165 near infrared dye | 0.07 gm |
| Indolenine Red magenta dye (CI 48070) as its PECHS salt | 0.015 gm |
| Methylethylketone | 0.90 gm |

also using a No. 4 wire-wound coating rod. The nitrocellulose Hercules, Inc, Wilmington, Del.) is an energetic material and provides an effective ablatable binder as taught in U.S. Pat. No. 5,156,938 Foley et al.). The coatings were imaged as in Example 3, with the following results.

| Sample | Line width (micrometers) | Sensitivity (J/cm$^2$) | Relative sensitivity |
|---|---|---|---|
| Test | 35.3 | 0.003 | 16 |
| Comparison 1 | 18.1 | 0.047 | 1 |
| Comparison 2 | 8.7 | 0.098 | 0.5 |

The melting point of 2-diazo-5,5-dimethylcyclohexane-1,3-dione is 107° C. The temperature for 5% mass loss is 93° C., and is below the melting point, while that for 95% mass loss is 141° C., below the temperature of the exothermic decomposition peak at 149° C. The temperature between the two mass loss points is very small, being 48° C. In consequence, this compound is very effective in assisting thermal mass transfer imaging. Furthermore, this sublimable compound is very effective compared to other materials known in the art to promote ablation.

EXAMPLE 9

A solution consisting of 0.3 gm of 20% by weight Borden novolac resin SD-126A in MEK, 0.4 gm of 5% by weight Resimene 747 (melamine formaldehyde resin, Monsanto Co., St. Louis, Mo.) in MEK, 0.02 gm 2-diazo-5,5-dimethylcyclohexane-1,3-dione, 0.05 gm IR-165 dye, 0.015 gm Indolenine Red PECHS dye, and 0.28 gm MEK was coated onto 58 micrometer thick polyester film with a No. 4 coating rod and dried 2 minutes at 80° C. A halftone scale (1–100%, 175 line) and a halftone image were transferred from the donor to the aluminum printing plate at a scan speed of 160 meters/second according to the exposure conditions in Example 3. Dots (1–99%) were transferred to the aluminum in the halftone scale. After being baked for 1 min at 384° C., the plate was run for 1000 copies on a Heidelberg GTO printing press using black lithographic ink with no evidence of image wear on the plate.

EXAMPLE 10

A solution consisting of 0.22 gm of 20% by weight Borden novolac resin SD-126A in MEK, 0.08 gm of 20% by weight of an acrylated epoxy (EBECRYL 3605) bisphenol-A base (UCB Radcure, Inc., Livingston, N.J.) in MEK, 0.04 gm 2-diazo-5,5-dimethylcyclohexane-1,3-dione, 0.04 gm IR-165 dye, 0.015 gm Indolenine Red PECHS dye, and 0.66 gm MEK was coated onto 58 micrometer thick polyester film with a No. 4 coating rod and dried 2 minutes at 80° C. A halftone scale (1–100%, 175 line) and a halftone image were transferred from the donor to the aluminum printing plate at a scan speed of 160 meters/second according to the exposure conditions in Example 3. Dots (1–99%) were transferred to the aluminum in the halftone scale. After being baked for 1 minute at 384° C., the plate was run for 1000 copies on a Heidelberg GTO printing press using black lithographic ink with no evidence of image wear on the plate.

EXAMPLE 11

Poly(2-diazo-3-oxobutyroxyethyl methacrylate) was prepared by polymerization of the monomer. The monomer was prepared according to the protocol described in Rao, Y. K. et al., *Indian J. Chem.*, 25B, 735 (1986).

2-Diazo-3-oxobutyroxyethyl methacrylate monomer was prepared as follows: a mixture of 2-acetoacetoxyethyl methacrylate (4.28 gm, 20 mmol, available from Eastman Chemical, Kingsport, Tenn.), dichloromethane (30 ml), and p-toluenesulfonyl azide (3.94 gm, 20 mmol) was cooled to 0° C. and then DBU (1,8-diazabicyclo[5.4.0]undec-7-ene, 4.48 ml, 30 mmol) was added dropwise. After the addition of DBU, the reaction mixture was stirred at room temperature for 15 minutes and then poured into a mixture of 10% KOH (100 ml) and diethyl ether (50 ml). The organic layer was separated and the aqueous layer was re-extracted with diethyl ether (50 ml). The organic extracts were combined and then washed sequentially with 3N HCl (50 ml), deionized water (2×50 ml) and saturated aqueous sodium chloride solution (50 ml). The organic layer was dried using anhydrous magnesium sulfate, filtered, and concentrated to give 4.39 gm of 2-diazo-3-oxobutyroxyethyl methacrylate as a pale yellow oil. $^1$H NMR (400 MHz, $CDCl_3$): δ 1.94 (s, 3H); 2.47 (s, 3H); 4.35–4.55 (m, 4H); 5.60 (s, 1H); 6.12 (s, 1H). IR: 2181 cm$^{-1}$. Peak decomposition temperature: 156° C. (by DSC).

The polymerization of the monomer was carried out as follows: a mixture of 2-diazo-3-oxobutyroxyethyl methacrylate (4.39 gm, 18.3 mmol), toluene (7 ml), hexanethiol (30 ml, available from Eastman Chemical, Kingsport, Tenn.), and 2,2'-azobis(2,4-dimethylvaleronitrile) (12 mg, available from Polysciences, Inc., Warrington, Pa.) was stirred at 65° C. for 6 hours. The reaction mixture was poured into petroleum ether (100 ml) and allowed to stand overnight. The solvent was decanted from the solidified polymer. The residue was dried under vacuum (<1300 Pascals) at room temperature to give 3.60 gm of poly(2-diazo-3-oxobutyroxyethyl methacrylate) as a pale yellow solid. IR: 2124 cm$^{-1}$. $M_w$=52,000; $M_n$=20,200.

A solution consisting of 0.085 gm poly(2-diazo-3-oxobutyroxyethyl methacrylate, 0.015 gm 2-diazo-5,5-dimethylcyclohexane-1,3-dione, 0.05 gm IR-165 dye, 0.015 gm Indolenine Red PECHS dye and 0.9 gm MEK was coated onto 58 micrometer thick polyester using a No. 4 coating bar and dried for 2 minutes at 80° C. The donor was placed in face-to-face contact with copper plated Kapton receptor (E. I. DuPont de Nemours, Wilmington, Del.). This assembly was imaged with the device used in Example 3 at a scan speed of 160 meters/sec to create circuit and line patterns. Lines of 30 micrometer width and 42 micrometer pitch were demonstrated to be feasible with this method. Coating transferred from the donor to the receptor to provide an etch resist on the surface of the copper. After the image was baked for 2 minutes at 180° C., the metal surface was patterned by etching the exposed copper with a solution consisting of 50 ml concentrated sulfuric acid, 400 ml water and 50 ml of 30% aqueous hydrogen peroxide for approximately 3 min at room temperature to completely remove the metal, leaving only the Kapton polymer in the areas that did not receive the resist. The resist was removed by wiping with a cotton swab soaked in MEK. The result of the process is a copper circuit on a Kapton substrate. Poor transfer resulted when 2-diazo-5,5-dimethylcyclohexane-1,3-dione was left out of the donor coating.

A 23% by weight cyan pigment millbase was prepared in MEK consisting of 47.17 gm cyan pigment 248-0165 (Sun Chemical Corp., Fort Lee, N.J.), 47.17 gm VAGH resin (Union Carbide Chemicals and Plastics Co., Inc., Danbury, Conn.), 5.66 gm Disperbyk 161 (BYK Chemie, Wallingford, Conn.), and 335 gm MEK. A dispersion consisting of 0.5 gm of the cyan pigment millbase, 0.05 gm IR-165 dye, 0.02 gm 2-diazo-5,5-dimethylcyclohexane-1,3-dione, and 0.6 gm MEK was coated with a No. 4 coating rod onto 58 micrometer thick polyester. The donor was contacted to a microscope glass slide receptor and put in the flat field scanner system. The donor/receptor combination was exposed through the polyester side of the donor at 3.5 watts and 7 watts to transfer lines of cyan pigment coating from the donor to the glass receptor with a width of approximately 117 micrometers and approximately 164 micrometers, respectively.

EXAMPLE 13

A solution consisting of 0.1 gm of 20% by weight novolac resin SD-126A in MEK, 0.08 gm 2-diazo-5,5-dimethylcyclohexane-1,3-dione, 0.05 gm IR-165 dye, and 0.82 gm MEK was coated with a No. 4 coating rod onto 58 micrometer thick polyester film and dried for 2 minutes at 80° C. A mixture consisting of 0.25 gm of an Aquis II phthalo green GW-3450 pigment dispersion (Heucotech, Ltd., Fairless Hills, Pa.), 0.75 gm water and 3 drops of 5% by weight FC-170 surfactant (Minnesota Mining and Manufacturing Co., St. Paul, Minn.) in water was then coated on top of the first layer using a No. 4 coating rod and dried for 2 minutes at 80° C. This donor was exposed in contact with a microscope glass slide receptor as in Example 12 at 5 watts to give lines of transferred green pigment layer approximately 140 micrometers wide on the receptor. The lines were somewhat jagged and contained many pinholes. The Example was repeated by substituting Aquis II QA magenta RW-3116 pigment dispersion (Heucotech, Ltd., Fairless Hills, Pa.) and Aquis II phthalo blue G/BW-3570 pigment dispersion (Heucotech, Ltd., Fairless Hills, Pa.) for Aquis II phthalo green GW-3450 pigment dispersion to give similar results. Very little transfer occurred under these exposure conditions if 2-diazo-5,5-dimethylcyclohexane-1,3-dione was left out of the bottom layer.

EXAMPLE 14

Example 13 was repeated except that 3 drops of JONCRYL 74 acrylic resin solution (S. C. Johnson and Son, Inc., Racine, Wis.) was added to the mixture containing the Aquis II QA magenta RW-3116 pigment dispersion before coating. Exposure as in Example 12 at 5 watts produced lines of approximately 160 micrometers on the glass receptor with few or no pinholes.

EXAMPLE 15

A solution consisting of 0.5 gm of 10% by weight novolac resin SD-126A in MEK, 0.05 gm 2-diazo-5,5-dimethylcyclohexane-1,3-dione, 0.03 gm of the near infrared dye of the following structure (prepared according to the procedure of U.S. Pat. No. 5,360,694 (Thien et al.), which is incorporated herein by reference):

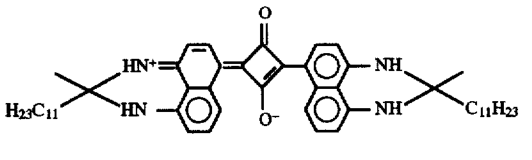

along with 0.015 gm Indolenine Red PECHS dye and 0.045 gm MEK was coated with a No. 4 coating bar onto 58 micrometer thick polyester film and dried for 2 minutes at 80° C. The donor film was contacted to a 150-micrometer grained, anodized, and silicated aluminum printing plate receptor in the external drum exposure unit. These donor/receptor samples were then exposed through the polyester side of the donor sheets using the unmodulated laser diode. Excellent transfer of material occurred from the donor to the aluminum receptor at drum speeds of 170–933 cm/second.

When the diazo compound was omitted from the donor, transfer to the aluminum receptor at drum speeds of up to 678 cm/second comparable to the donor with diazo compound. However, the donor sheet without 2-diazo-5,5-dimethylcyclohexane-1,3-dione gave inferior transfer to the aluminum receptor at drum speeds of 763 cm/second and 933 cm/second compared to the donor sheet containing diazo compound. These results suggest that sublimable compounds can improve thermal mass transfer at higher scanning speeds when the rate of normal gas-producing chemical processes may be a limiting factor. 2-Diazo-5,5-dimethylcyclohexane-1,3-dione results in improved transfer of novolac resin from a polyester donor sheet to an aluminum printing plate receptor not only for 1064 nm laser irradiation (Example 8) but also for 811 nm irradiation.

All publications, patents, and patent documents are incorporated by reference herein, as though individually incorporated by reference. The invention has been described with reference to various specific and preferred embodiments and techniques. However, it should be understood that many variations and modifications may be made while remaining within the spirit and scope of the invention.

What is claimed is:

1. A thermal transfer donor element comprising a substrate having coated on at least a portion thereof, in one or more layers:

(a) a substantially colorless sublimable compound;

(b) a radiation absorber; and (c) a thermal mass transfer material;

wherein the sublimable compound is free of acetylenic groups and has a 5% mass loss temperature of at least about 55° C. and a 95% mass loss temperature of no more than about 200° C. at a heating rate of 10° C./minute under a nitrogen flow of 50 ml/minute, and said sublimable compound has a melting point temperature that is at least about said 5% mass loss temperature and a peak thermal decomposition temperature that is at least about said 95% mass loss temperature.

2. The thermal transfer donor element according to claim 1 wherein said sublimable compound has a 5% mass loss temperature of at least about 60° C. and a 95% mass loss temperature of no more than about 180° C. at a heating rate of 10° C./minute under a nitrogen flow of 50 ml/minute, and said sublimable compound has a melting point temperature that is at least about said 5% mass loss temperature and a peak thermal decomposition temperature that is at least about said 95% mass loss temperature.

3. The thermal transfer donor element according to claim 1 wherein said sublimable compound has a 5% mass loss temperature of at least about 70° C. and a 95% mass loss temperature of no more than about 165° C. at a heating rate of 10° C./minute under a nitrogen flow of 50 ml/minute, and said sublimable compound has a melting point temperature that is at least about said 5% mass loss temperature and a peak thermal decomposition temperature that is at least about said 95% mass loss temperature.

4. The thermal transfer donor element according to claim 1 wherein the substrate is coated with a first layer comprising the sublimable compound and the radiation absorber and a second layer comprising the thermal mass transfer material coated onto the first layer.

5. The thermal transfer donor element according to claim 1 comprising a substrate having coated sequentially thereon:

(a) a first layer comprising the radiation absorber;

(b) a second layer comprising the sublimable compound; and (c) a third layer comprising the thermal mass transfer material.

6. The thermal transfer donor element according to claim 1 wherein said sublimable compound is selected from the group consisting of 2-diazo-5,5-dimethyl-cyclohexane-1,3-dione, camphor, naphthalene, borneol, butyramide, valeramide, 4-tert-butyl-phenol, furan-2-carboxylic acid, succinic anhydride, and 1-adamantanol, 2-adamantanone.

7. A thermal transfer system comprising:

(a) an image-receiving element; and (b) a donor element comprising:

(i) a substantially colorless sublimable compound;

(ii) a radiation absorber; and (iii) a thermal mass transfer material;

wherein the sublimable compound is free of acetylenic groups and has a 5% mass loss temperature of at least about 55° C. and a 95% mass loss temperature of no more than about 200° C. at a heating rate of 10° C./minute under a nitrogen flow of 50 ml/minute, and said sublimable compound has a melting point temperature that is at least about said 5% mass loss temperature and a peak thermal decomposition temperature that is at least about said 95% mass loss temperature.

8. The thermal transfer system according to claim 7 wherein said sublimable compound has a 5% mass loss temperature of at least about 60° C. and a 95% mass loss temperature of no more than about 180° C. at a heating rate of 10° C./minute under a nitrogen flow of 50 ml/minute, and said sublimable compound has a melting point temperature that is at least about said 5% mass loss temperature and a peak thermal decomposition temperature that is at least about said 95% mass loss temperature.

9. The thermal transfer system according to claim 7 wherein said sublimable compound has a 5% mass loss temperature of at least about 70° C. and a 95% mass loss temperature of no more than about 165° C. at a heating rate of 10° C./minute under a nitrogen flow of 50 ml/minute, and said sublimable compound has a melting point temperature that is at least about said 5% mass loss temperature and a peak thermal decomposition temperature that is at least about said 95% mass loss temperature.

10. The thermal transfer system according to claim 7 wherein said sublimable compound is selected from the group consisting of 2-diazo-5,5-dimethyl-cyclohexane-1,3-dione, camphor, naphthalene, borneol, butyramide, valeramide, 4-tert-butyl-phenol, furan-2-carboxylic acid, succinic anhydride, and 1-adamantanol, 2-adamantanone.

11. A process for forming an image comprising the steps of:

(a) bringing the thermal transfer donor element of claim 1 into contact with an image-receiving element; and (b) imagewise exposing the construction of (a), thereby transferring the thermal mass transfer material of the thermal transfer donor element to the image-receiving element.

12. The process according to claim 11 wherein the imagewise exposure in step (b) utilizes an infrared laser.

13. The process according to claim 11 wherein said sublimable compound contributes to said image an optical density of no more than about 0.3 between 450 nm and 500 nm, and no more than about 0.2 from 500 nm to 700 nm.

14. The process according to claim 11 wherein the image-receiving element is a lithographic printing plate.

15. The process according to claim 14 wherein the imagewise exposure in step (b) utilizes an infrared laser.

16. The process according to claim 14 including a step of crosslinking the thermal mass transfer material after transfer to the lithographic printing plate.

17. The process according to claim 11 including a step of crosslinking the thermal mass transfer material after transfer to the image-receiving element.

18. The process according to claim 11 wherein said sublimable compound is selected from the group consisting of 2-diazo-5,5-dimethyl-cyclohexane-1,3-dione, camphor, naphthalene, borneol, butyramide, valeramide, 4-tert-butyl-phenol, furan-2-carboxylic acid, succinic anhydride, and 1-adamantanol, 2-adamantanone.

* * * * *